US012635462B2

(12) United States Patent
Li et al.

(10) Patent No.: US 12,635,462 B2
(45) Date of Patent: May 19, 2026

(54) SHELF STATUS DETERMINATION

(71) Applicant: Taiwan Semiconductor Manufacturing Company Limited, Hsin-Chu (TW)

(72) Inventors: Guancyun Li, Miaoli County (TW); Ching-Jung Chang, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 264 days.

(21) Appl. No.: 18/232,472

(22) Filed: Aug. 10, 2023

(65) Prior Publication Data

US 2025/0054795 A1     Feb. 13, 2025

(51) Int. Cl.
*H01L 21/677* (2006.01)
*G06T 7/73* (2017.01)
*H01L 21/68* (2006.01)

(52) U.S. Cl.
CPC .......... *H01L 21/67769* (2013.01); *G06T 7/74* (2017.01); *H01L 21/681* (2013.01); *G06T 2207/30148* (2013.01)

(58) Field of Classification Search
CPC ... H01L 21/67769; H01L 21/681; G06T 7/74; G06T 2207/30148
See application file for complete search history.

(56) References Cited

U.S. PATENT DOCUMENTS

2010/0268374 A1* 10/2010 Jung ................. H01L 21/67265
                                                           414/280
2010/0290873 A1* 11/2010 Bonora ............. H01L 21/67769
                                                           414/225.01

2022/0063907 A1* 3/2022 Park ........................ G06T 7/73
2023/0374746 A1* 11/2023 High ....................... A47F 10/04
2024/0180629 A1* 6/2024 Ben-Yishai ............... G06T 7/74

FOREIGN PATENT DOCUMENTS

TW          486614 B       5/2002
TW     201014766 A        4/2010
TW     201918431 A        5/2019

OTHER PUBLICATIONS

Office Action received in corresponding Taiwanese patent application No. 112137682, dated Sep. 30, 2024, 22 pages.

* cited by examiner

*Primary Examiner* — Jay Khandpur

(74) *Attorney, Agent, or Firm* — Cooper Legal Group, LLC

(57)     ABSTRACT

A method is provided. The method includes performing a first stocking operation associated with a first shelving unit using a stocking vehicle. The first stocking operation includes a put operation including transferring a first product unit from a load support component of the stocking vehicle to a first storage location over the first shelving unit, or a get operation including transferring the first product unit from the first storage location over the first shelving unit to the load support component of the stocking vehicle. The method includes capturing, using a first image sensor coupled to the stocking vehicle, a first image of a view associated with a first predefined position of the first shelving unit during the first stocking operation. The method includes determining, based upon the first image, whether the first shelving unit is associated with a potential shift event.

20 Claims, 18 Drawing Sheets

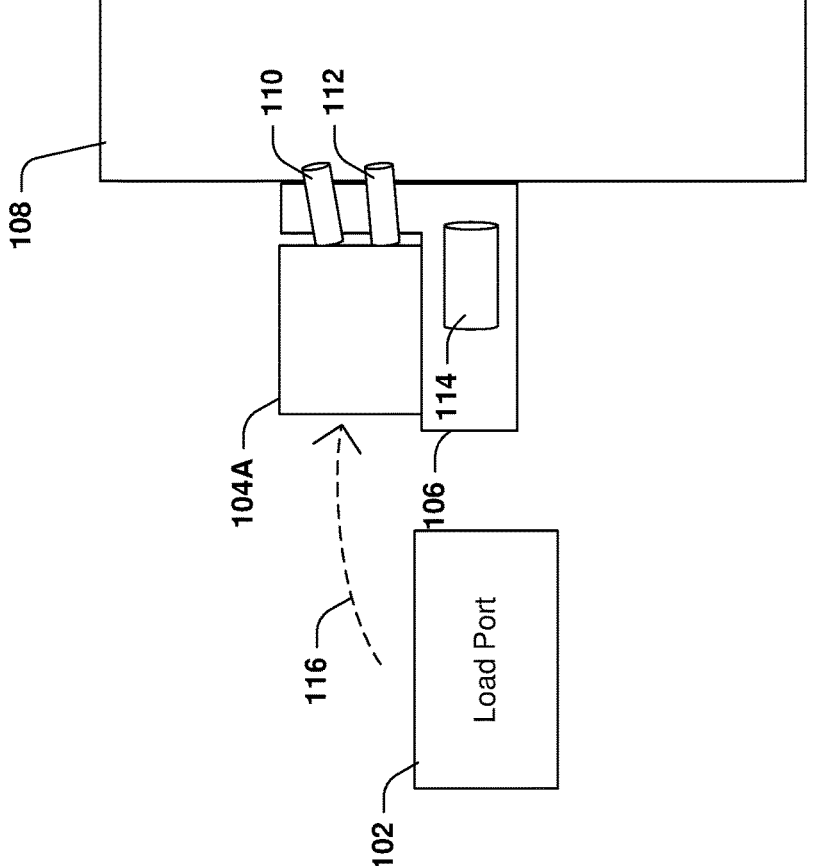
FIG. 1A

100

124

212

122

202

212

212

208

206

204

210

208

236  228  230  232

234  226

224  222

302

304

306

308

310

312

314

450

Figure 9:
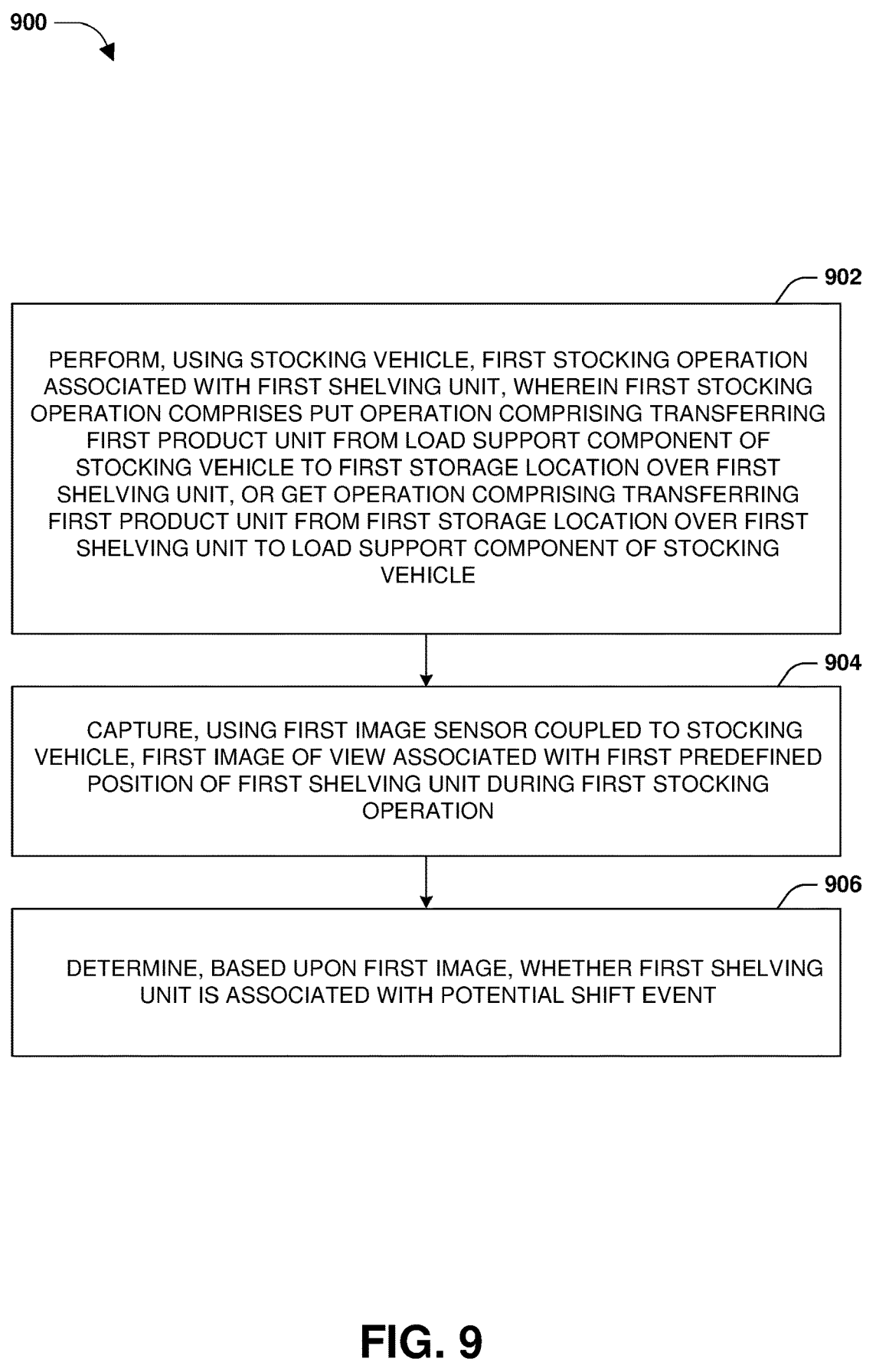

900 ⮑

```
                                                            ┌─ 902
┌──────────────────────────────────────────────────────────┐
│                                                          │
│   PERFORM, USING STOCKING VEHICLE, FIRST STOCKING        │
│   OPERATION ASSOCIATED WITH FIRST SHELVING UNIT,         │
│   WHEREIN FIRST STOCKING OPERATION COMPRISES PUT         │
│   OPERATION COMPRISING TRANSFERRING FIRST PRODUCT        │
│   UNIT FROM LOAD SUPPORT COMPONENT OF STOCKING           │
│   VEHICLE TO FIRST STORAGE LOCATION OVER FIRST           │
│   SHELVING UNIT, OR GET OPERATION COMPRISING             │
│   TRANSFERRING FIRST PRODUCT UNIT FROM FIRST             │
│   STORAGE LOCATION OVER FIRST SHELVING UNIT TO LOAD      │
│   SUPPORT COMPONENT OF STOCKING VEHICLE                  │
│                                                          │
└──────────────────────────────────────────────────────────┘
```

```
                                                            ┌─ 904
┌──────────────────────────────────────────────────────────┐
│                                                          │
│   CAPTURE, USING FIRST IMAGE SENSOR COUPLED TO           │
│   STOCKING VEHICLE, FIRST IMAGE OF VIEW ASSOCIATED       │
│   WITH FIRST PREDEFINED POSITION OF FIRST SHELVING       │
│   UNIT DURING FIRST STOCKING OPERATION                   │
│                                                          │
└──────────────────────────────────────────────────────────┘
```

```
                                                            ┌─ 906
┌──────────────────────────────────────────────────────────┐
│                                                          │
│   DETERMINE, BASED UPON FIRST IMAGE, WHETHER FIRST       │
│   SHELVING UNIT IS ASSOCIATED WITH POTENTIAL SHIFT       │
│   EVENT                                                  │
│                                                          │
└──────────────────────────────────────────────────────────┘
```

SHELF STATUS DETERMINATION

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more semiconductor fabrication processes are performed to form semiconductor devices on, in, and/or from a semiconductor wafer. The semiconductor wafer is stored in a wafer storage device during a period between semiconductor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a schematic view of a first product unit transferred from a first location to a load support component of a stocking vehicle, in accordance with some embodiments.

FIG. 9 is a flow diagram illustrating a method, in accordance with some embodiments.

DETAILED DESCRIPTION

Figure 1B:
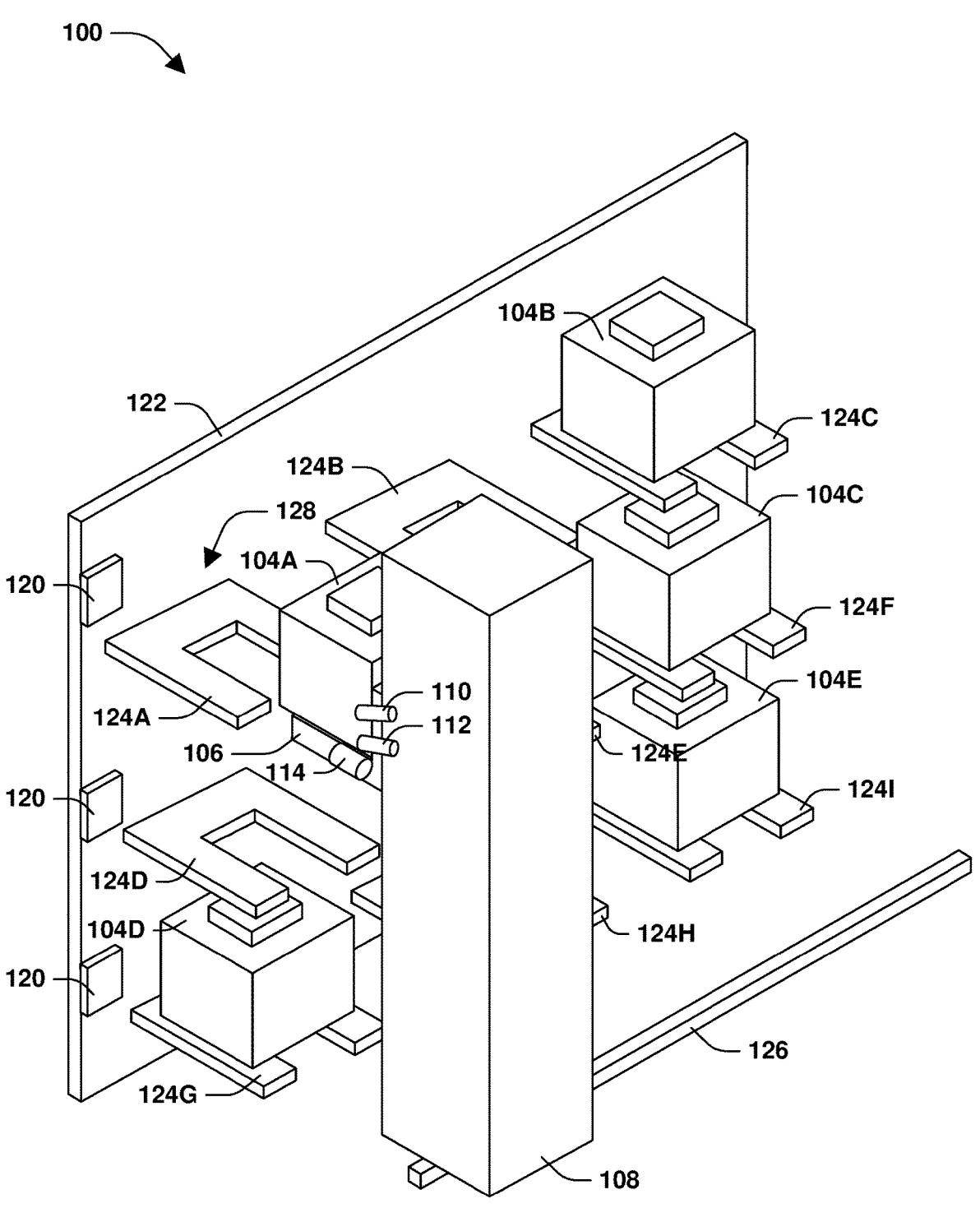
FIG. 1B illustrates a perspective view of one or more components of an automated material handling system performing a stocking operation, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, an automated material handling system uses shelving units for storing product units, such as wafer storage devices. The automated material handling system includes a shelf status monitoring apparatus configured to monitor shelving units of the automated material handling system during stocking operations. The shelf status monitoring apparatus includes an image sensor coupled to a stocking vehicle. The stocking vehicle performs a stocking operation to load a product unit onto a shelving unit or unload a product unit from the shelving unit. During the stocking operation, the image sensor captures an image associated with a predefined position of the shelving unit. Whether the shelving unit is associated with a potential shift event, corresponding to a shift of the shelving unit from the predefined position to a different position, is determined using the image. In some embodiments, the shelving unit is flagged as out of service in response to determining that the shelving unit is associated with the potential shift event.

In some embodiments, in response to flagging the shelving unit as out of service, an inspection is triggered to determine a validity of the determination that the shelving unit is associated with the potential shift event. The inspection is performed using an inspection apparatus. The inspection includes capturing a second image of the shelving unit, and determining, based upon the second image, whether the shelving unit is damaged. In some embodiments, a first portion of the shelving unit is depicted in the first image captured using the shelf status monitoring apparatus and a second portion of the shelving unit is depicted in the second image captured using the inspection apparatus. In some embodiments, in response to determining, via the inspection, that the shelving unit is damaged, one or more maintenance operations are performed to repair the shelving unit. In some embodiments, the shelving unit is repaired using an automatic maintenance machine in response to the inspection.

Thus, in accordance with some embodiments, the shelf status monitoring apparatus is used to monitor shelving units during stocking operations to automatically identify potentially damaged shelving units. Shelving units that are flagged by the shelf status monitoring apparatus are automatically inspected using the inspection apparatus, in accordance with some embodiments. In some embodiments, in response to the inspection apparatus confirming that a shelving unit is damaged, the shelving unit is repaired, such as automatically repaired using the automatic maintenance machine.

FIGS. 1A-1G illustrate aspects associated with an automated material handling system 100 for transporting and/or storing product units according to some embodiments. In some embodiments, the automated material handling system 100 comprises at least one of a stocking vehicle 108, a shelf status monitoring apparatus, or a storage system comprising a plurality of shelving units for storing product units. In some embodiments, at least a portion of the shelf status monitoring apparatus is coupled to the stocking vehicle 108. In some embodiments, the shelf status monitoring apparatus is configured to monitor shelving units of the storage system during stocking operations performed using the stocking vehicle 108.

Aspects of a first stocking operation performed using the stocking vehicle 108 are shown in FIGS. 1A-1D. The first stocking operation comprises a first put operation in which a first product unit 104A is at least one of (i) transferred from a first location to a load support component 106 of the stocking vehicle 108, or (ii) transferred from the load support component 106 of the stocking vehicle 108 to a first storage location 128 over a first shelving unit 124A (shown in FIGS. 1B-1C and FIGS. 1E-1F) of the plurality of shelving units.

FIG. 1A illustrates a schematic view of the first product unit 104A transferred 116 from the first location to the load support component 106 of the stocking vehicle 108. In some embodiments, the first product unit 104A comprises a wafer storage device. In some embodiments, the wafer storage device comprises at least one of a cassette pod, a front opening unified pod (FOUP), a reticle pod, or other type of wafer storage device. In some embodiments, the wafer storage device is used to store one or more wafers, such as a batch of wafers. In some embodiments, the one or more wafers are stacked vertically in the wafer storage device. In some embodiments, the one or more wafers are supported by a support frame, of the wafer storage device, having at least one of wafer shelves or wafer slots. In some embodiments, a wafer stored in the wafer storage device comprises one or more layers, such as at least one of a semiconductor layer, a conductor layer, or an insulator layer.

In some embodiments, the first location corresponds to a location of a load port 102 of a process machine. In some embodiments, the process machine comprises at least one of (i) physical vapor deposition (PVD) equipment, (ii) chemical vapor deposition (CVD) equipment, (iii) plating equipment, (iv) etching equipment, such as at least one of plasma etching equipment, wet etching equipment, dry etching equipment, reactive-ion etching (RIE) equipment, atomic layer etching (ALE) equipment, buffered oxide etching equipment, or ion beam milling equipment, (v) lithography equipment, (vi) chemical mechanical planarization (CMP) equipment, or (vii) other equipment.

In some embodiments, the first stocking operation is performed in response to completion of a first process, such a semiconductor fabrication process, performed on the one or more wafers stored in the first product unit 104A, such as the wafer storage device. In some embodiments, the first process comprises at least one of (i) a PVD process, (ii) a CVD process, (iii) a plating process, (iv) an etching process, such as at least one of a plasma etching process, a wet etching process or a dry etching process, (v) a lithographic equipment, (vi) a CMP process, or (vii) one or more other suitable processes.

In some embodiments, when the first product unit 104A is docked onto the load port 102, a wafer stored in the first product unit 104A is unloaded from the first product unit 104A and inserted into the process machine. In some embodiments, after inserting the wafer into the process machine, the process machine is used to perform the first process on the wafer. In some embodiments, in response to completing the first process on the wafer, the wafer is removed from the process machine and loaded into the first product unit 104A, such as the wafer storage device. In some embodiments, multiple wafers are processed using the process machine at a time. In some embodiments, a single wafer is processed using the process machine at a time. In some embodiments, the process machine is used to perform the first process on each wafer of one, some and/or all wafers stored in the first product unit 104A to produce a set of one or more processed wafers, and the set of one or more processed wafers are loaded into the first product unit 104A. In some embodiments, the first product unit 104A is transferred 116 from the load port 102 to the load support component 106 of the stocking vehicle 108 after the set of one or more processed wafers are loaded into the first product unit 104A. In some embodiments, the first product unit 104A is transferred 116 from the first location, such as the load port 102, to the load support component 106 using a mechanical device (not shown).

In some embodiments, the stocking vehicle 108 comprises at least one of a forklift, a crane, a crane fork, an overhead transport vehicle, a guided transport vehicle that travels on predetermined routes or tracks, or other suitable vehicle. In some embodiments, the load support component 106 corresponds to a platform to support a load, such as the first product unit 104A, during movement of the stocking vehicle 108. In some embodiments, the load support component 106 comprises a fork of the stocking vehicle 108, such as the forklift or the crane fork. In some embodiments, the stocking vehicle 108 controls a vertical position of the load support component 106, such as by lifting or lowering the load support component 106 to access load ports and/or shelving units at different elevations.

Figure 1C:
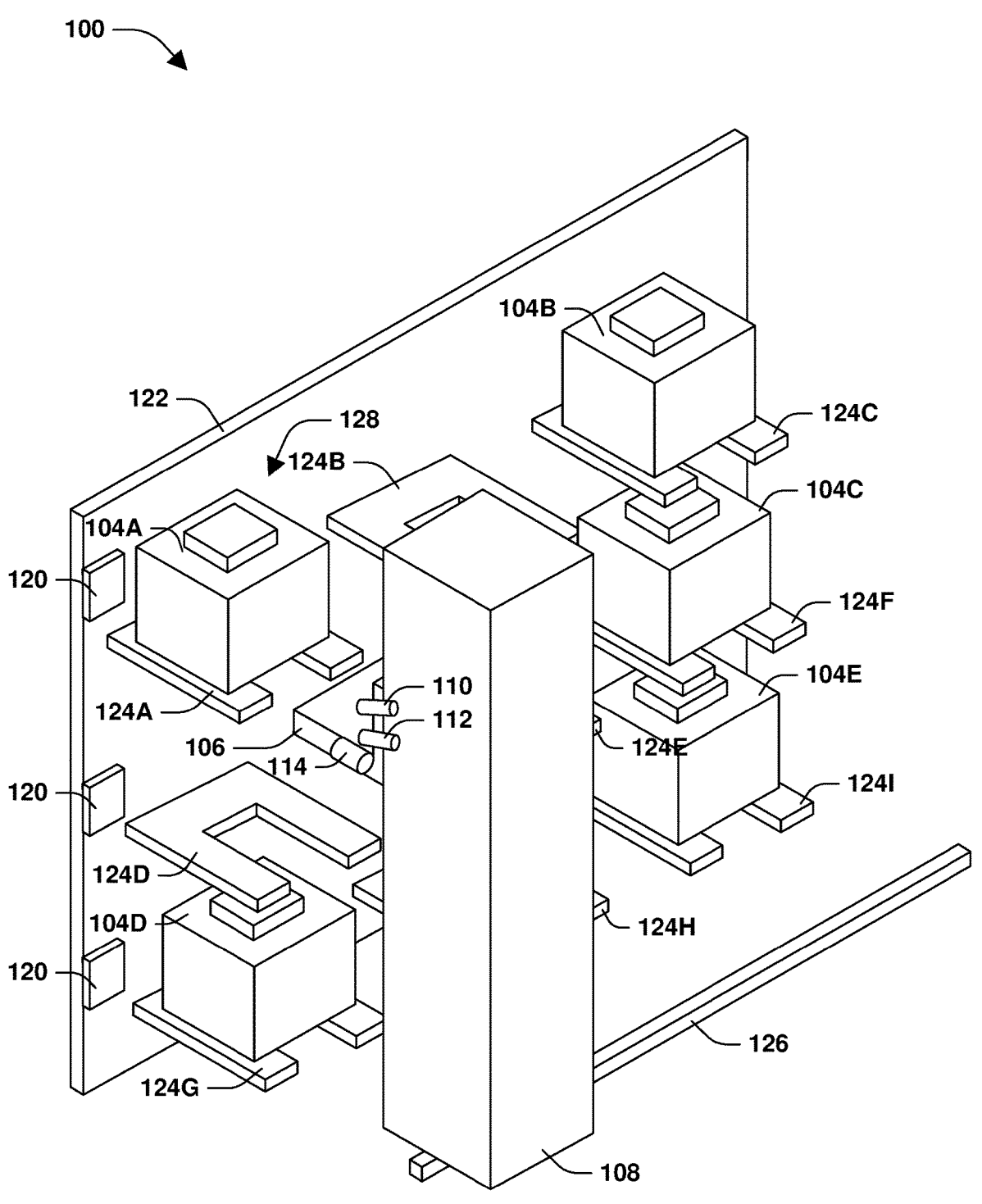
FIG. 1C illustrates a perspective view of one or more components of an automated material handling system performing a stocking operation, in accordance with some embodiments.

In some embodiments, after the first product unit 104A is transferred to the load support component 106, the stocking vehicle 108 moves to a first position proximal the first shelving unit 124A, such as the position of the stocking vehicle 108 shown in FIGS. 1B-1C, to transfer the first product unit 104A from the load support component 106 to a first storage location 128 (shown in FIGS. 1B-1C) over the first shelving unit 124A. FIGS. 1B-1C illustrate perspective views of transfer of the first product unit 104A from the load support component 106 to the first storage location 128 over the first shelving unit 124A. In some embodiments, the stocking vehicle 108 is moved to the first position using a track 126. In some embodiments, the track 126 guides movement of the stocking vehicle 108. In some embodiments, at least one of the first shelving unit 124A or other shelving units 124B, 124C, 124D, 124E, 124F, 124G, 124H, and/or 124I are affixed to a wall 122, such as a storage partition wall of the storage system. FIG. 1B shows the first product unit 104A disposed on the load support component 106 prior to transferring the first product unit 104A from the load support component 106 to the first storage location 128 over the first shelving unit 124A. In some embodiments, product units 104B, 104C, 104D, and 104E are stored in storage locations over shelving units 124C, 124F, 124G, and 124I, respectively. FIG. 1C shows the first product unit 104A stored in the first storage location 128 over the first shelving unit 124A after transferring the first product unit 104A to the first storage location 128. In some embodiments, the first product unit 104A is transferred from the load support component 106 to the first storage location 128 using a mechanical device (not shown). In some embodiments, the first product unit 104A is supported by the first shelving unit 124A when the first product unit 104A is in the first storage location 128. In some embodiments, the first product unit 104A is set upon the first shelving unit 124A and/or is in direct contact with the first shelving unit 124A when the first product unit 104A is in the first storage location 128. In some embodiments, when the first product unit 104A is in the first storage location 128, the first shelving unit 124A is set upon and/or is in direct contact with at least one of a layer, an object, etc. over the first shelving unit 124A. In some embodiments, at least one of the layer, the object, etc. separates the first shelving unit 124A from the first product unit 104A when the first product unit 104A is in the first storage location 128.

In some embodiments, the shelf status monitoring apparatus comprises a first image sensor 114, such as a camera, configured to capture a first image associated with the first shelving unit 124A. In some embodiments, the first image sensor 114 captures the first image during the first stocking operation. In some embodiments, the first stocking operation spans from a first time to a second time. In some embodiments, the first time corresponds to a time when (or before or after) the first product unit 104A is transferred 116 from the first location to the load support component 106 of the stocking vehicle 108. In some embodiments, the second time corresponds to a time when (or before or after) the first product unit 104A is transferred from the load support component 106 of the stocking vehicle 108 to the first storage location 128 over the first shelving unit 124A. In some embodiments, a view of the first image sensor 114 is a function of a position of at least one of the load support component 106 or the stocking vehicle 108. In some embodiments, the first image sensor 114 has a constant position relative to at least one of the load support component 106 or the stocking vehicle 108 so as to have a changing view during movement of at least one of the load support component 106 or the stocking vehicle 108. In some embodiments, a mechanical device is used to adjust a position of the first image sensor 114 relative to at least one of the load support component 106 or the stocking vehicle 108.

In some embodiments, the first image corresponds to an image of a first view associated with a first predefined position of the first shelving unit 124A. In some embodiments, the first predefined position corresponds to a correct position of the first shelving unit 124A. In some embodiments, the first image is captured at a time, during the first stocking operation, when the first image sensor 114 has the first view of the first predefined position of the first shelving unit 124A. In some embodiments, the shelf status monitoring apparatus determines that the first image sensor 114 has the first view of the first predefined position of the first shelving unit 124A based upon a current position of a first component matching a first reference position corresponding to the first image sensor 114 having the first view of the first predefined position. In some embodiments, the first component comprises at least one of the first image sensor 114, the load support component 106, or other component coupled to the stocking vehicle 108. In some embodiments, the current position is determined using a position determination module of the shelf status monitoring apparatus. In some embodiments, the position determination module is calibrated using at least one of one or more calibration components 120 or one or more predefined positions. In some embodiments, a calibration component of the one or more calibration components 120 is coupled to the wall 122. In some embodiments, calibrating the position determination module comprises at least one of (i) capturing an image of a view of a calibration component 120 associated with the first predefined position of the first component, or (ii) mapping the first predefined position associated with the calibration component 120 to a position of the first component when the image of the view of the calibration component 120 is captured. In some embodiments, when the position determination module of the shelf status monitoring apparatus is calibrated, the position determination module is able to determine when the first component has the first reference position. In some embodiments, the first image is captured when the first component has the first reference position such that the first image has the first view of the first predefined position associated with the first shelving unit 124A.

Figure 1D:
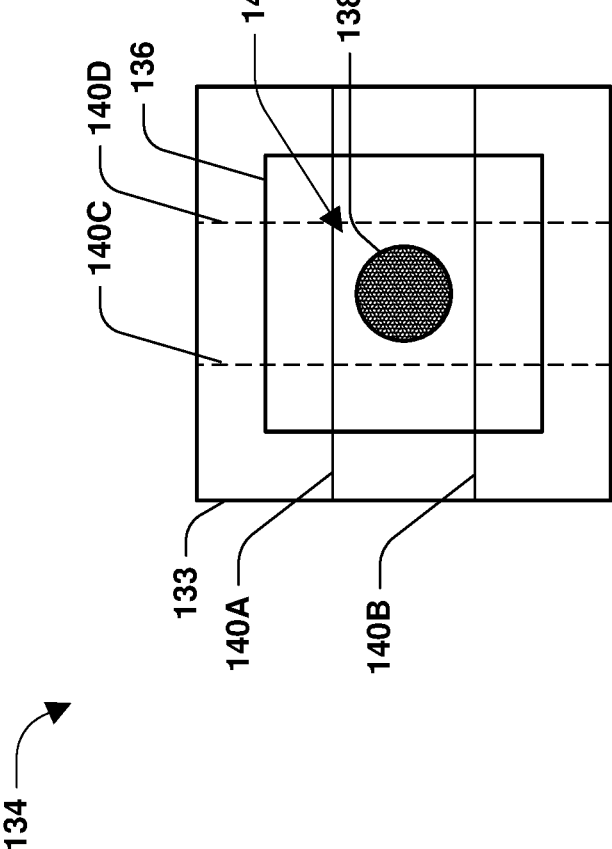
FIG. 1D illustrates a representation of an image captured during a stocking operation, in accordance with some embodiments.

FIG. 1D illustrates a representation of the first image (shown with reference number 134) according to some embodiments. In some embodiments, the first image 134 is used to determine whether the first shelving unit 124A is associated with a first potential shift event, such as using one or more of the techniques provided below. In some embodiments, the shelf status monitoring apparatus comprises a computer configured to determine, based upon the first image 134, whether the first shelving unit 124A is associated with the first potential shift event. In some embodiments, the first potential shift event corresponds to a shift of the first shelving unit 124A from the first predefined position to a different position, such as an incorrect position. In some embodiments, the first potential shift event corresponds to at least a portion of the first shelving unit 124A at least one of bending, sagging or becoming damaged, such as due to an impact and/or pressure of an object on the first shelving unit 124A. In some embodiments, the first potential shift event corresponds to an event in which the first shelving unit 124A is damaged during a stocking operation, such as when at least one of the load support component 106, the stocking vehicle 108, a product unit, etc. impinges upon and/or displaces the first shelving unit 124A while the product unit loaded into or unloaded from the first storage location 128 over the first shelving unit 124A.

Figure 1E:
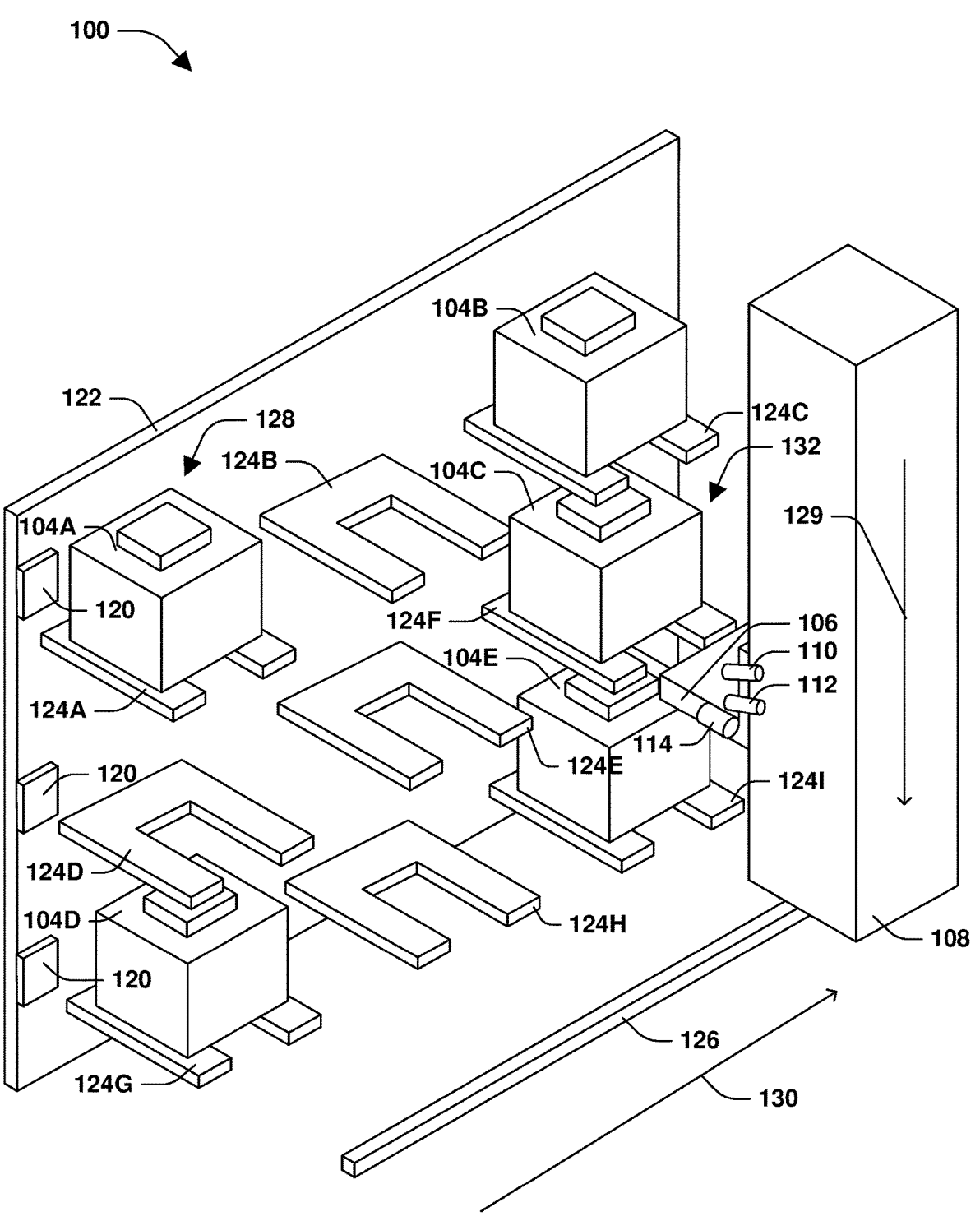
FIG. 1E illustrates a perspective view of one or more components of an automated material handling system performing a stocking operation, in accordance with some embodiments.
Figure 1F:
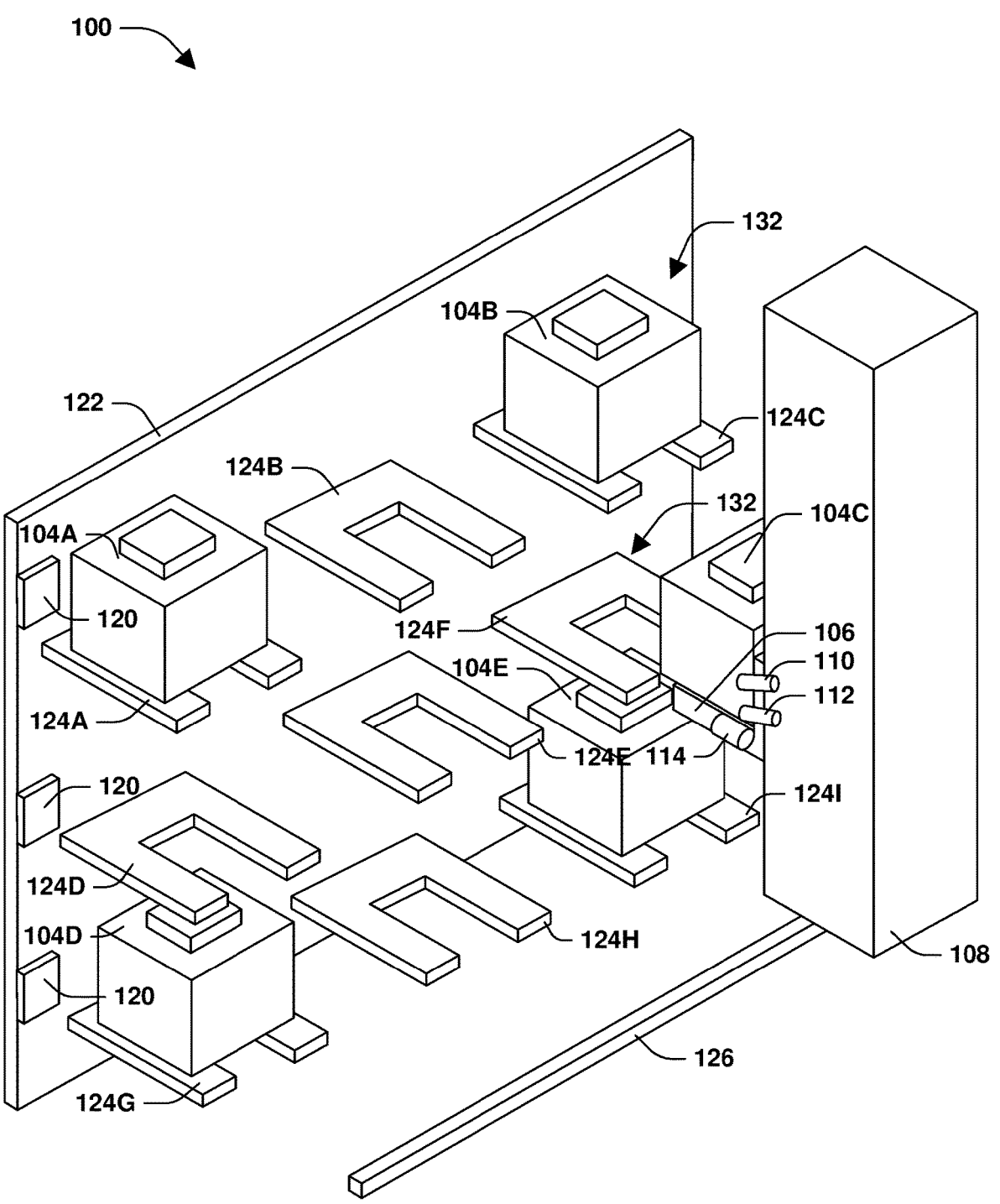
FIG. 1F illustrates a perspective view of one or more components of an automated material handling system performing a stocking operation, in accordance with some embodiments.
Figure 1G:
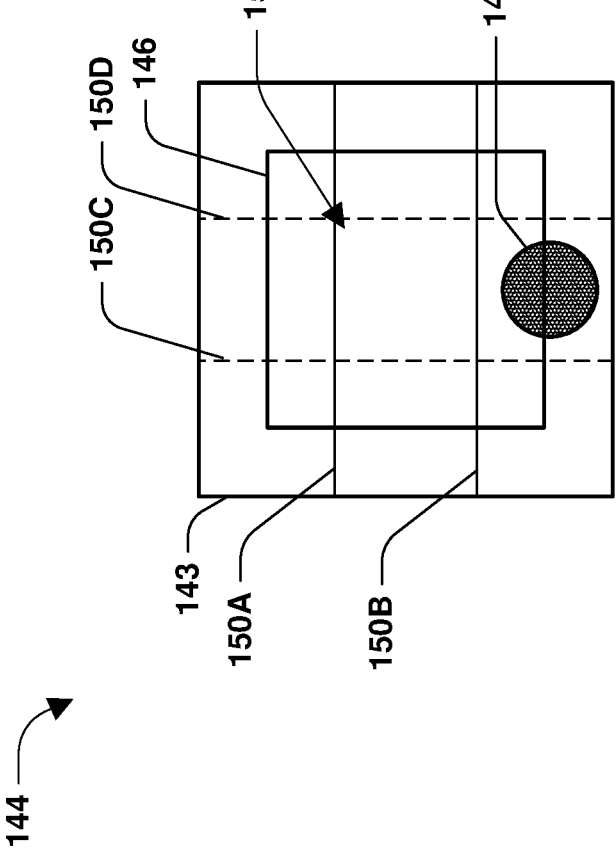
FIG. 1G illustrates a representation of an image captured during a stocking operation, in accordance with some embodiments.

Aspects of a second stocking operation are shown in FIGS. 1E-1G. The second stocking operation comprises a first get operation in which a second product unit 104C is at least one of (i) transferred from a second storage location 132 over a second shelving unit 124F (shown in FIGS. 1B-1C and FIGS. 1E-1F) to the load support component 106 of the stocking vehicle 108, or (ii) transferred from the load support component 106 of the stocking vehicle 108 to a second location. In some embodiments, the second location comprises a second load port of a second process machine.

In some embodiments, the second stocking operation is performed after the first stocking operation. In some embodiments, after the first stocking operation, the stocking vehicle 108 moves to a second position proximal the second shelving unit 124F, such as the position of the stocking vehicle 108 shown in FIGS. 1E-1F, to transfer the second product unit 104C from the second storage location 132 to the load support component 106. In some embodiments, the stocking vehicle 108 moves in a first direction 130 along the track 126 to move from the first position (shown in FIGS. 1B-1C) proximal the first shelving unit 124A to the second position (shown in FIGS. 1E-1F) proximal the second shelving unit 124F. In some embodiments, the second shelving unit 124F is at a different, such as lower, elevation than the first shelving unit 124A. In some embodiments, the load support component 106 moves in a second direction 129 to move from a first elevation associated with accessing the first storage location 128 over the first shelving unit 124A to a second elevation associated with accessing the second storage location 132 over the second shelving unit 124F.

FIGS. 1E-1F illustrate perspective views of transfer of the second product unit 104C from the second storage location 132 over the second shelving unit 124F to the load support component 106. FIG. 1E shows the second product unit 104C disposed in the second storage location 132 over the second shelving unit 124F prior to transferring the second product unit 104C from the second storage location 132 to the load support component 106. In some embodiments, the second product unit 104C is supported by the second shelving unit 124F when the second product unit 104C is in the second storage location 132. In some embodiments, the second product unit 104C is set upon the second shelving unit 124F and/or is in direct contact with the second shelving unit 124F when the second product unit 104C is in the second storage location 132. In some embodiments, when the second product unit 104C is in the second storage location 132, the second shelving unit 124F is set upon and/or is in direct contact with at least one of a layer, an object, etc. over the second shelving unit 124F. In some embodiments, at least one of the layer, the object, etc. separates the second shelving unit 124F from the second product unit 104C when the second product unit 104C is in the second storage location 132.

FIG. 1F shows the second product unit 104C disposed on the load support component 106 after transferring the second product unit 104C from the second storage location 132 to the load support component 106. In some embodiments, the second product unit 104C is transferred from the second storage location 132 to the load support component 106 using a mechanical device (not shown).

In some embodiments, the first image sensor 114 is used to capture a second image associated with the second shelving unit 124F. In some embodiments, the first image sensor 114 captures the second image during the second stocking operation. In some embodiments, the second stocking operation spans from a third time to a fourth time. In some embodiments, the first time corresponds to a time when (or before or after) the stocking vehicle 108 starts moving from the first position proximal the first shelving unit 124A to the second position proximal the second shelving unit 124F. In some embodiments, the fourth time corresponds to a time when (or before or after) the second product unit 104C is transferred from the second storage location 132 over the second shelving unit 124F to the load support component 106 of the stocking vehicle 108.

In some embodiments, the second image corresponds to an image of a second view associated with a second predefined position of the second shelving unit 124F. In some embodiments, the second predefined position corresponds to a correct position of the second shelving unit 124F. In some embodiments, the second image is captured at a time, during the second stocking operation, when the first image sensor 114 has the second view of the second predefined position of the second shelving unit 124F. In some embodiments, the shelf status monitoring apparatus determines that the first image sensor 114 has the second view of the second predefined position of the second shelving unit 124F based upon a current position of the first component matching a second reference position corresponding to the first image sensor 114 having the second view of the second predefined position. In some embodiments, the position determination module is able to determine when the first component has the second reference position. In some embodiments, the second image is captured when the first component has the second reference position such that the second image has the second view of the second predefined position associated with the second shelving unit 124F.

FIG. 1G illustrates a representation of the second image (shown with reference number 144) according to some embodiments. In some embodiments, the second image 144 is used to determine whether the second shelving unit 124F is associated with a second potential shift event, such as using one or more of the techniques provided below. In some embodiments, the computer of the shelf status monitoring apparatus is configured to determine, based upon the second image 144, whether the second shelving unit 124F is associated with the second potential shift event. In some embodiments, the second potential shift event corresponds to a shift of the second shelving unit 124F from the second predefined position to a different position, such as an incorrect position. In some embodiments, the second potential shift event corresponds to at least a portion of the second shelving unit 124F at least one of bending, sagging or becoming damaged, such as due to an impact and/or pressure of an object on the second shelving unit 124F. In some embodiments, the second potential shift event corresponds to an event in which the second shelving unit 124F is damaged during a stocking operation, such as when at least one of the load support component 106, the stocking vehicle 108, a product unit, etc. impinges upon and/or displaces the second shelving unit 124F while the product unit is loaded into or unloaded from the second storage location 132 over the second shelving unit 124F.

Figures 2A, 2B:
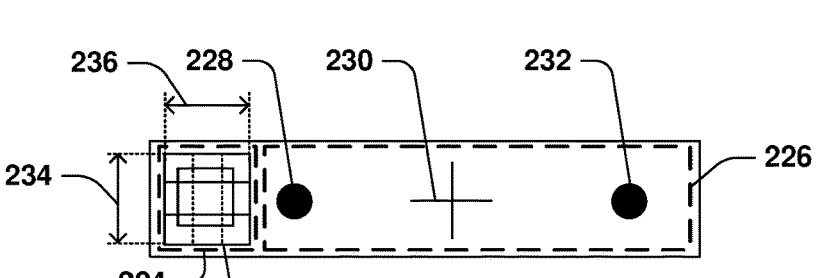
FIG. 2A illustrates a perspective view of a shelving unit, in accordance with some embodiments.
FIG. 2B illustrates a stopper of a shelving unit, in accordance with some embodiments.

FIG. 2A illustrates a perspective view of a shelving unit 124 according to some embodiments. In some embodiments, the shelving unit 124 corresponds to at least one of the first shelving unit 124A, the second shelving unit 124F, or other shelving unit of the storage system. In some embodiments, the shelving unit 124 is affixed to the wall 122 via one or more attachment mechanisms 212. In some embodiments, the one or more attachment mechanisms 212 comprise at least one of one or more shelf brackets, one or more bolts, one or more clamps, or other suitable mechanisms for affixing the shelving unit 124 to the wall 122. In some embodiments, the shelving unit 124 comprises a body 206.

In some embodiments, the shelving unit 124 comprises one or more stoppers to at least one of (i) support a product unit (not shown) disposed on the shelving unit 124, or (ii) prevent the product unit from falling off the shelving unit 124. In some embodiments, a stopper of the one or more stoppers protrudes upwards from the body 206 of the shelving unit 124, and thus the stopper provides resistance to the product unit escaping the shelving unit 124. In some embodiments, the one or more stoppers comprise at least one of a stopper 208, a stopper 210, a stopper 202, or a stopper 204.

FIG. 2B illustrates the stopper 208 according to some embodiments. In some embodiments, the stopper 208 comprises at least one of a reflective label 222 in a first portion 224 of the stopper 208 or one or more openings in a second portion 226 of the stopper 208. In some embodiments, the reflective label 222 is affixed to the stopper 208, such as using an adhesive to bind the reflective label 222 to the stopper 208. In some embodiments, the reflective label 222 comprises a sticker having the adhesive on a first side of the sticker. In some embodiments, the reflective label 222 comprises a reflective material having at least a threshold reflectivity. In some embodiments, the reflective label 222 comprises one or more markings, such as at least one of one or more lines, one or more shapes, etc. printed on the reflective label 222. In some embodiments, the reflective label 222 has a rectangular shape, such as a square shape. In some embodiments, a first length 234 of a first side of the reflective label 222 is between about 1 millimeter and about 50 millimeters, such as about 3 millimeters. In some embodiments, a second length 236 of a second side of the reflective label 222 is between about 1 millimeter and about 50 millimeters, such as about 3 millimeters. In some embodiments, each side of the reflective label 222 has about the same length, such as a length of about 3 millimeters. In some embodiments, the one or more openings comprise at least one of an opening 228, an opening 230, or an opening 232. In FIG. 2B, the opening 228 is a first circle-shaped opening, the opening 230 is a cross-shaped opening, and opening 232 is a second circle-shaped opening. Other shapes of openings of the one or more openings are within the scope of the present disclosure. In some embodiments, the stopper 210 has one, some, and/or all of the features provided herein with respect to the stopper 208.

Referring back to FIG. 1D, in some embodiments, the first view of the first image 134 corresponds to a first portion of the first shelving unit 124A when the first shelving unit 124A has the first predefined position. For example, if the first shelving unit 124A has the first predefined position during the first stocking operation and is not damaged and/or displaced, the first portion of the first shelving unit 124A is depicted in the first view. In some embodiments, when the first shelving unit 124A is damaged and/or displaced, at least a portion of the first portion of the first shelving unit 124A is not depicted in the first image 134, such as due, at least in part, to the first portion of the first shelving unit 124A being displaced from a predefined position of the first portion of the first shelving unit 124A. In some embodiments, the predefined position of the first portion of the first shelving unit 124A corresponds to a position of the first portion of the first shelving unit 124A when at least one of the first shelving unit 124A has the first predefined position or the first shelving unit 124A is not damaged. In some embodiments, the first portion of the first shelving unit 124A comprises at least a portion of a stopper, such as the stopper 208 and/or the stopper 210 illustrated in FIG. 2A, of the first shelving unit 124A. In some embodiments, the first portion of the first shelving unit 124A comprises a first reflective label 133 depicted in the first image 134 illustrated in FIG. 1D. In some embodiments, the first reflective label 133 corresponds to the reflective label 222 illustrated in FIG. 2B.

In some embodiments, whether the first shelving unit 124A is associated with the first potential shift event is determined based upon a comparison of a position of a first reflection 138 of a first beam of light depicted in the first image 134 with a position of a first landmark depicted in the first image 134. The first reflection 138 of the first beam of light corresponds to a reflection of the first beam of light off of the first reflective label 133 or other region of the first shelving unit 124A. In some embodiments, the first landmark corresponds to the first reflective label 133. In some embodiments, the first landmark comprises one or more first markings of the first reflective label 133 depicted in the first image 134. In some embodiments, the one or more first markings comprise at least one of a line 140A, a line 140B, a line 140C, a line 140D, or a rectangle 136. In some embodiments, the one or more first markings have a different color than a background color of the first reflective label 133, such that the one or more first markings are visually apparent and/or identifiable in the first image 134. In some embodiments, the one or more first markings form a grid used to determine whether the first shelving unit 124A is associated with the first potential shift event, such as by determining a position of the first reflection 138 of the first beam of light relative to the grid depicted in the first image 134. In some embodiments, the first shelving unit 124A is determined not to be associated with the first potential shift event based upon an entirety of the first reflection 138 of the first beam of light depicted in the first image 134 being within the rectangle 136. In some embodiments, the first shelving unit 124A is determined not to be associated with the first potential shift event based upon the entirety of the first reflection 138 of the first beam of light depicted in the first image 134 being within a region 142 corresponding to a rectangle defined by lines 140A, 140B, 140C and 140D. In some embodiments, the region 142 corresponds to a center region of the first reflective label 133. In some embodiments, the first shelving unit 124A is determined not to be associated with the first potential shift event based upon at least a threshold proportion of the first reflection 138 of the first beam of light depicted in the first image 134 being within the rectangle 136. In some embodiments, the first shelving unit 124A is determined not to be associated with the first potential shift event based upon at least a threshold proportion of the first reflection 138 of the first beam of light depicted in the first image 134 being within the region 142 defined by lines 140A, 140B, 140C and 140D.

In some embodiments, the first beam of light is generated using a first light generation device 110 (shown in FIGS. 1A-1C and FIGS. 1E-1F) of the shelf status monitoring apparatus. In some embodiments, the first light generation device 110 comprises a laser generation device. In some embodiments, the first light generation device 110 emits the first beam of light, such as a laser beam, during the first stocking operation. In some embodiments, a position of the first beam of light is a function of a position of at least one of the load support component 106 or the stocking vehicle 108. In some embodiments, the first light generation device 110 has a constant position relative to at least one of the load support component 106 or the stocking vehicle 108. In some embodiments, a mechanical device is used to adjust a position of the first light generation device 110 relative to at least one of the load support component 106 or the stocking vehicle 108. In some embodiments, the first light generation device 110 emits the first beam of light while the first image sensor 114 is used to capture the first image 134. In some embodiments, the first light generation device 110 is positioned such that when the first image 134 is captured, the first beam of light is emitted towards the predefined position of the first portion of the first shelving unit 124A, such as towards a predefined position of the region 142 (shown in FIG. 1D) of the first reflective label 133 defined by the one or more first markings of the first reflective label 133. In some embodiments, an amplifier value associated with generating the first beam of light using an amplifier, such as an input amplifier, of the first light generation device 110 is at least about a first threshold amplifier value. In some embodiments, the first threshold amplifier value is between about 3,000 and about 5,000.

Embodiments are contemplated in which whether or not the first shelving unit 124A is associated with the first potential shift event is determined using one or more techniques other than those provided herein, such as using one or more other types of sensors other than (and/or in addition to) the first image sensor 114, other types of landmarks and/or markings other than (and/or in addition to) those explicitly shown in the annexed drawings, etc.

Referring back to FIG. 1G, in some embodiments, the second view of the second image 144 corresponds to a first portion of the second shelving unit 124F when the second shelving unit 124F has the second predefined position. For example, if the second shelving unit 124F has the second predefined position during the second stocking operation and is not damaged and/or displaced, the first portion of the second shelving unit 124F is depicted in the second view. In some embodiments, when the second shelving unit 124F is damaged and/or displaced, at least a portion of the first portion of the second shelving unit 124F is not depicted in the second image 144, such as due, at least in part, to the first portion of the second shelving unit 124F being displaced from a predefined position of the first portion of the second shelving unit 124F. In some embodiments, the predefined position of the first portion of the second shelving unit 124F corresponds to a position of the first portion of the second shelving unit 124F when at least one of the second shelving unit 124F has the second predefined position or the second shelving unit 124F is not damaged. In some embodiments, the first portion of the second shelving unit 124F comprises at least a portion of a stopper, such as the stopper 208 and/or the stopper 210 illustrated in FIG. 2A, of the second shelving unit 124F. In some embodiments, the first portion of the second shelving unit 124F comprises a second reflective label 143 depicted in the second image 144 illustrated in FIG. 1G. In some embodiments, the second reflective label 143 corresponds to the reflective label 222 illustrated in FIG. 2B.

In some embodiments, whether the second shelving unit 124F is associated with the second potential shift event is determined based upon a comparison of a second reflection 148 of a second beam of light depicted in the second image 144 with a position of a second landmark depicted in the second image 144. In some embodiments, the second landmark corresponds to the second reflective label 143. In some embodiments, the second landmark comprises one or more second markings of the second reflective label 143 depicted in the second image 144. In some embodiments, the one or more second markings comprise at least one of a line 150A, a line 150B, a line 150C, a line 150D, or a rectangle 146. In some embodiments, the one or more second markings have a different color than a background color of the second reflective label 143, such that the one or more second markings are visually apparent and/or identifiable in the second image 144. In some embodiments, the one or more second markings form a grid used to determine whether the second shelving unit 124F is associated with the second potential shift event, such as by determining a position of the second reflection 148 of the second beam of light relative to the grid depicted in the second image 144. In some embodiments, the second shelving unit 124F is determined to be associated with the second potential shift event based upon an entirety of the second reflection 148 of the second beam of light depicted in the second image 144 being outside the rectangle 146. In some embodiments, the second shelving unit 124F is determined to be associated with the second potential shift event based upon the entirety of the second reflection 148 of the second beam of light depicted in the second image 144 being outside a region 152 corresponding to a rectangle defined by lines 150A, 150B, 150C and 150D. In some embodiments, the region 152 corresponds to a center region of the second reflective label 143. In some embodiments, the second shelving unit 124F is determined to be associated with the second potential shift event based upon at least a threshold proportion of the second reflection 148 of the second beam of light depicted in the second image 144 being outside the rectangle 146. In some embodiments, the second shelving unit 124F is determined to be associated with the second potential shift event based upon at least a threshold proportion of the second reflection 148 of the second beam of light depicted in the second image 144 being outside the region 152 defined by lines 150A, 150B, 150C and 150D.

In some embodiments, a first shelf health status associated with the second shelving unit 124F and the second potential shift event is determined based upon the second image 144. In some embodiments, the first shelf health status is determined to be a first value, such as "warning", based upon a determination that the second image 144 meets one or more first conditions. In some embodiments, the first shelf health status is determined to be a second value, such as "damaged", based upon a determination that the second image 144 meets one or more second conditions. In some embodiments, the one or more second conditions are different than the one or more first conditions. In some embodiments, the first shelf health status is determined to be the first value based upon at least a threshold proportion of the second reflection 148 of the second beam of light depicted in the second image 144 being outside the region 152 defined by lines 150A, 150B, 150C and 150D. In some embodiments, the first shelf health status is determined to be the first value based upon at least a threshold proportion of the second reflection 148 of the second beam of light depicted in the second image 144 being outside the rectangle 146.

Figures 3A, 3B, 3C, 3D, 3E, 3F, 3G:
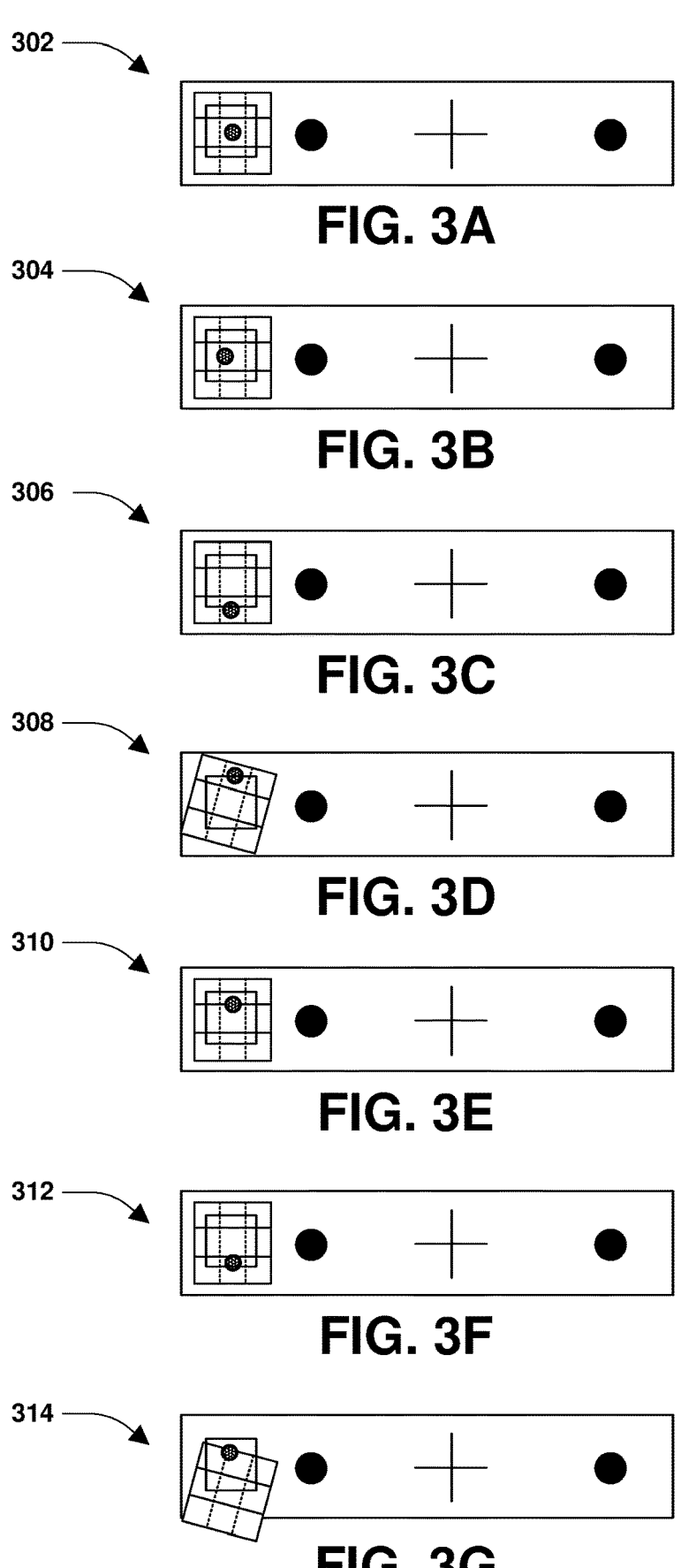
FIG. 3A illustrates a representation of an image, in accordance with some embodiments.
FIG. 3B illustrates a representation of an image, in accordance with some embodiments.
FIG. 3C illustrates a representation of an image, in accordance with some embodiments.
FIG. 3D illustrates a representation of an image, in accordance with some embodiments.
FIG. 3E illustrates a representation of an image, in accordance with some embodiments.
FIG. 3F illustrates a representation of an image, in accordance with some embodiments.
FIG. 3G illustrates a representation of an image, in accordance with some embodiments.

FIGS. 3A-3G provide various example scenarios of determining whether a shelving unit is associated with a potential shift event based upon an image captured using the techniques provided herein. FIG. 3A illustrates an example representation of an image 302 captured using the techniques provided herein, according to some embodiments. In some embodiments, using one or more of the techniques provided herein, at least one of a stocker controller or the computer of the shelf status monitoring apparatus determines, based upon the image 302, that a shelving unit associated with the image 302 is not associated with a potential shift event. FIG. 3B illustrates an example representation of an image 304 captured using the techniques provided herein, according to some embodiments. In some embodiments, using one or more of the techniques provided herein, at least one of the stocker controller or the computer of the shelf status monitoring apparatus determines, based upon the image 304, that at least one of (i) a shelving unit associated with the image 304 is associated with a potential shift event, or (ii) a shelf health status associated with the shelving unit is the first value, such as "warning". FIG. 3C illustrates an example representation of an image 306 captured using the techniques provided herein, according to some embodiments. In some embodiments, using one or more of the techniques provided herein, at least one of the stocker controller or the computer of the shelf status monitoring apparatus determines, based upon the image 306, that at least one of (i) a shelving unit associated with the image 306 is associated with a potential shift event, or (ii) a shelf health status associated with the shelving unit comprises at least one of the second value or a third value, such as "crane fork shift", indicating that the shelving unit is damaged by impact from a stocking vehicle. FIG. 3D illustrates an example representation of an image 308 captured using the techniques provided herein, according to some embodiments. In some embodiments, using one or more of the techniques provided herein, at least one of the stocker controller or the computer of the shelf status monitoring apparatus determines, based upon the image 308, that at least one of (i) a shelving unit associated with the image 308 is associated with a potential shift event, or (ii) a shelf health status associated with the shelving unit comprises at least one of the second value or a fourth value, such as "reflector shift", indicating that a reflective label of the shelving unit is at least one of damaged or displaced from a correct position. FIG. 3E illustrates an example representation of an image 310 captured using the techniques provided herein, according to some embodiments. In some embodiments, using one or more of the techniques provided herein, at least one of the stocker controller or the computer of the shelf status monitoring apparatus determines, based upon the image 310, that at least one of a shelving unit associated with the image 310 is not associated with a potential shift event. FIG. 3F illustrates an example representation of an image 312 captured using the techniques provided herein, according to some embodiments. In some embodiments, using one or more of the techniques provided herein, at least one of the stocker controller or the computer of the shelf status monitoring apparatus determines, based upon the image 312, that at least one of (i) a shelving unit associated with the image 312 is associated with a potential shift event, or (ii) a shelf health status associated with the shelving unit is the first value, such as "warning". FIG. 3G illustrates an example representation of an image 314 captured using the techniques provided herein, according to some embodiments. In some embodiments, using one or more of the techniques provided herein, at least one of the stocker controller or the computer of the shelf status monitoring apparatus determines, based upon the image 314, that at least one of (i) a shelving unit associated with the image 314 is associated with a potential shift event, or (ii) a shelf health status associated with the shelving unit comprises at least one of the second value or the fourth value, such as "reflector shift", indicating that a reflective label of the shelving unit is at least one of damaged or displaced from a correct position.

In some embodiments, the second beam of light is generated using the first light generation device 110 (shown in FIGS. 1A-1C and FIGS. 1E-1F) of the shelf status monitoring apparatus. In some embodiments, the first light generation device 110 emits the second beam of light, such as a laser beam, during the second stocking operation. In some embodiments, the first light generation device 110 emits the second beam of light while the first image sensor 114 is used to capture the second image 144. In some embodiments, the first light generation device 110 is positioned such that when the second image 144 is captured, the second beam of light is emitted towards the predefined position of the first portion of the second shelving unit 124F, such as towards a predefined position of the region 152 (shown in FIG. 1G) of the second reflective label 143 defined by the one or more second markings of the second reflective label 143.

In some embodiments, one or more components of the stocking vehicle 108 are positioned differently during a put operation, such as the first stocking operation, than a get operation, such as the second stocking operation. In some embodiments, due to the difference in position of the one or more components between the first stocking operation and the second stocking operation, the first light generation device 110 is not positioned properly to emit a beam of light towards the predefined position of the first portion of the second shelving unit 124F. In some embodiments, the beam of light emitted by the first light generation device 110 may be emitted in a direction that is not towards the predefined position of the first portion of the second shelving unit 124F. In some embodiments, the second beam of light is generated using a second light generation device 112 (shown in FIGS. 1A-1C and FIGS. 1E-1F) of the shelf status monitoring apparatus. In some embodiments, the second light generation device 112 is positioned differently than the first light generation device 110. In some embodiments, the second light generation device 112 comprises a laser generation device. In some embodiments, the second light generation device 112 emits the second beam of light, such as a laser beam, during the second stocking operation. In some embodiments, a position of the second beam of light is a function of a position of at least one of the load support component 106 or the stocking vehicle 108. In some embodiments, the second light generation device 112 has a constant position relative to at least one of the load support component 106 or the stocking vehicle 108. In some embodiments, a mechanical device is used to adjust a position of the second light generation device 112 relative to at least one of the load support component 106 or the stocking vehicle 108. In some embodiments, the second light generation device 112 emits the second beam of light while the first image sensor 114 is used to capture the second image 144. In some embodiments, the second light generation device 112 is positioned such that when the second image 144 is captured, the second beam of light is emitted towards the predefined position of the first portion of the second shelving unit 124F, such as towards a predefined position of the region 152 (shown in FIG. 1G) of the second reflective label 143 defined by the one or more second markings of the second reflective label 143. In some embodiments, an amplifier value associated with generating the second beam of light using an amplifier, such as an input amplifier, of the second light generation device 112 is at least about a second threshold amplifier value. In some embodiments, the second threshold amplifier value is between about 3,000 and about 5,000.

In some embodiments, based upon the determination that the first shelving unit 124A is not associated with the first potential shift event, the computer of the shelf status monitoring apparatus transmits an indication, to the stocker controller, that at least one of (i) the first shelving unit 124A is not associated with the first potential shift event, or (ii) the first shelving unit 124A is in operating condition to be used for storing a product unit in the first storage location 128 over the first shelving unit 124A. In some embodiments, based upon the determination that the first shelving unit 124A is not associated with the first potential shift event, the stocker controller uses the first shelving unit 124A to store a product unit in the first storage location 128. In some embodiments, based upon the determination that the first shelving unit 124A is not associated with the first potential shift event, the first shelving unit 124A is included in a list of candidate shelving units. In some embodiments, the list of candidate shelving units indicates shelving units that are each determined to be in operating condition to be used for storing a product unit. In some embodiments, the stocker controller selects the first shelving unit 124A, from among the list of candidate shelving units, for use in storing a product unit. In some embodiments, in response to selecting the first shelving unit 124A, the stocker controller controls a stocking vehicle, such as the stocking vehicle 108, to transfer the product unit to the first storage location 128 over the first shelving unit 124A.

In some embodiments, in response to determining that the second shelving unit 124F is associated with the second potential shift event, the second shelving unit 124F is flagged as out of service by at least one of the stocker controller or the computer of the shelf status monitoring apparatus. In some embodiments, when the second shelving unit 124F is flagged as out of service, the stocker controller does not store a product unit in the second storage location 132 over the second shelving unit 124F. In some embodiments, based upon the determination the second shelving unit 124F is associated with the second potential shift event, the stocker controller does not use the second shelving unit 124F to store a product unit in the second storage location 132. In some embodiments, flagging the second shelving unit 124F as out of service comprises including the second shelving unit 124F in a list of flagged shelving units. In some embodiments, the list of flagged shelving units indicates shelving units that are flagged as out of service, such as due to being associated with a potential shift event. In some embodiments, the stocker controller does not use the second shelving unit 124F to store a product unit in the second storage location 132 based upon the second shelving unit 124F being included in the list of flagged shelving units.

In some embodiments, in response to determining that the second shelving unit 124F is associated with the second potential shift event, the computer of the shelf status monitoring apparatus transmits a shift event signal to the stocker controller. In some embodiments, the shift event signal comprises at least one of (i) an indication of the second shelving unit 124F, (ii) an indication of a location of the second shelving unit 124F, (iii) an indication that the second shelving unit 124F is associated with the second potential shift event, (iv) the second image 144, (v) an indication that the second shelving unit is out of service, (vi) an indication of the first shelf health status, or (vii) other information associated with at least one of the second shelving unit 124F or the second potential shift event.

In some embodiments, in response to determining that the second shelving unit 124F is associated with the second potential shift event, at least one of the stocker controller or the computer of the shelf status monitoring apparatus transmits an instruction to repair the second shelving unit 124F to a maintenance event scheduling module. In some embodiments, the maintenance event scheduling module schedules a maintenance event for the second shelving unit 124F in response to at least one of the instruction to repair the second shelving unit 124F or determining that the second shelving unit 124F is associated with the second potential shift event. In some embodiments, one or more resources are allocated to repair the second shelving unit 124F during the maintenance event. In some embodiments, in response to repairing the second shelving unit 124F, the second shelving unit 124F is removed from the list of flagged shelving units.

Figure 4A:
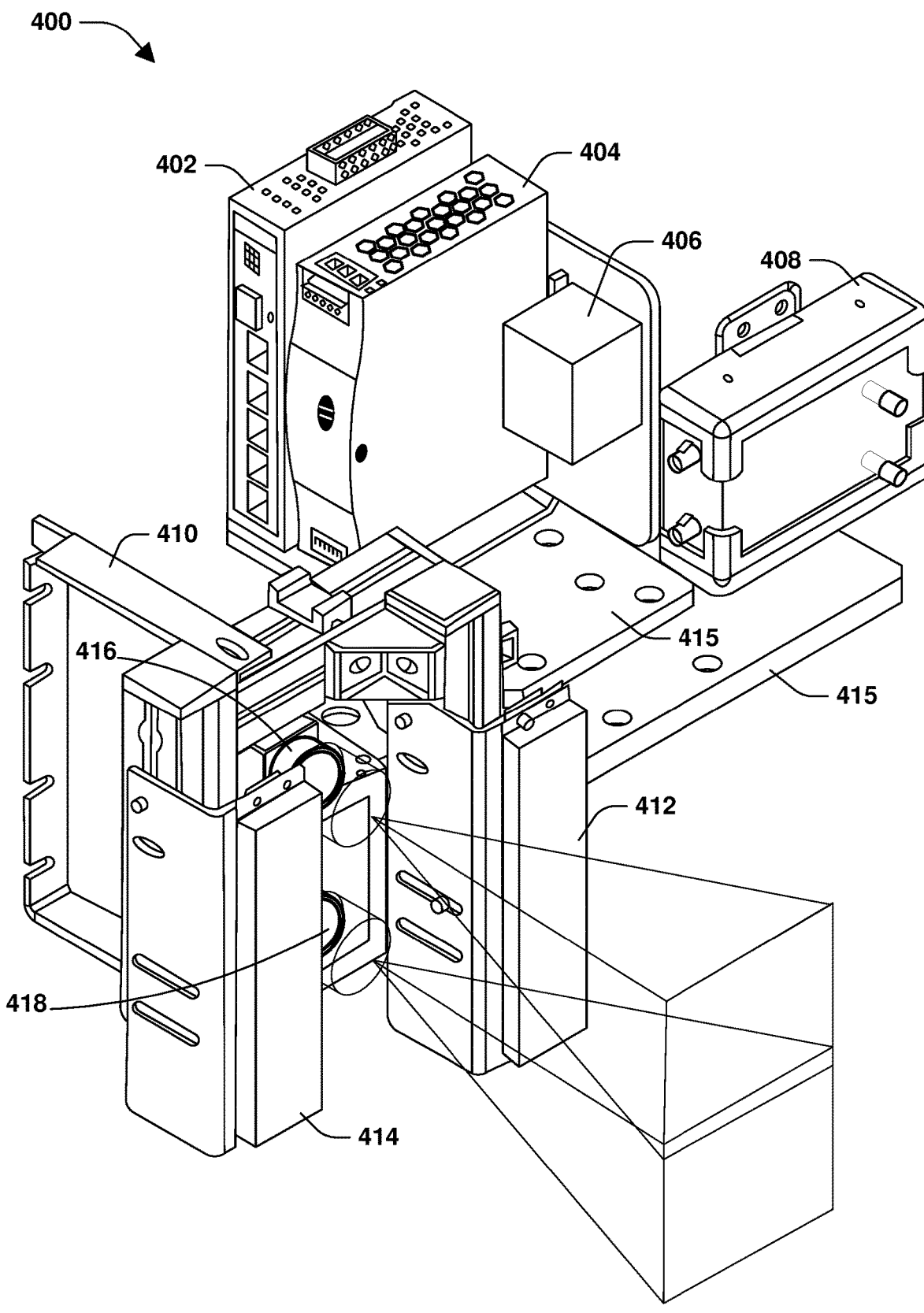
FIG. 4A illustrates a perspective view of at least a portion of a shelf status monitoring apparatus, in accordance with some embodiments.
Figure 4B:
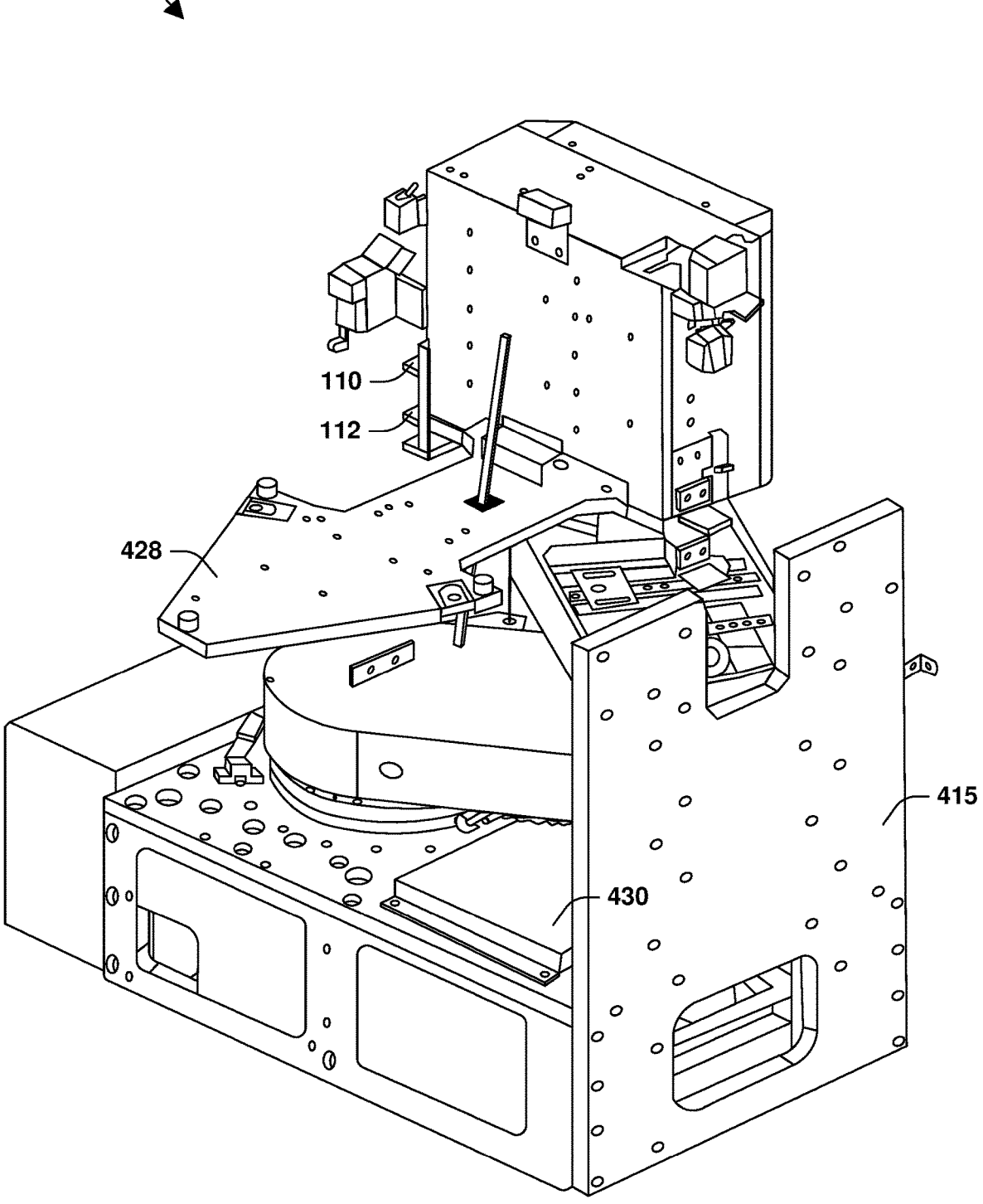
FIG. 4B illustrates a perspective view of at least a portion of a shelf status monitoring apparatus, in accordance with some embodiments.

FIGS. 4A-4B illustrate the shelf status monitoring apparatus according to some embodiments. FIG. 4A illustrates a perspective view of a first portion 400 of the shelf status monitoring apparatus. In some embodiments, the first portion 400 of the shelf status monitoring apparatus comprises at least one of (i) a second image sensor 416, (ii) a third image sensor 418, (iii) a first light controller 408, (iv) a first communication module 402, (v) a first direct current (DC)/DC converter 404, (vi) a terminal block 406, (vii) a light resource 412, (viii) a light resource 414, (ix) a frame 410, or (x) other component. In some embodiments, the first image sensor 114 corresponds to at least one of the second image sensor 416 or the third image sensor 418. In some embodiments, the second image sensor 416 is used for capturing images of shelving units during put operations and the third image sensor 418 is used for capturing images of shelving units during put operations. In some embodiments, one or more components of the stocking vehicle 108 are positioned differently during a put operation, such as the first stocking operation, than a get operation, such as the second stocking operation. In some embodiments, (i) the second image sensor 416 is positioned properly to capture the first view of the first predefined position associated with the first shelving unit 124A during the first stocking operation, (ii) the second image sensor 416 is not positioned properly to capture the second view of the second predefined position associated with the second shelving unit 124F during the second stocking operation, (iii) the third image sensor 418 is not positioned properly to capture the first view of the first predefined position associated with the first shelving unit 124A during the first stocking operation, or (iv) the third image sensor 418 is positioned properly to capture the second view of the second predefined position associated with the second shelving unit 124F during the second stocking operation. In some embodiments, the second image sensor 416 is used to capture the first image 134 and the third image sensor 418 is used to capture the second image 144. Embodiments are contemplated in which at least one of the second image sensor 416 is used to capture the second image 144 or the third image sensor 418 is used to capture the first image 134.

In some embodiments, at least one of the light resource 412 or the light resource 414 generates light. In some embodiments, at least one of the light resource 412 or the light resource 414 generates the light to illuminate surroundings of the shelf status monitoring apparatus. In some embodiments, at least one of the light resource 412 or the light resource 414 generates the light to enable at least one of the second image sensor 416 or the third image sensor 418 to generate shelf monitoring images, such as at least one of the first image 134, the second image 144, etc., with increased resolution and/or clarity. In some embodiments, the first light controller 408 is configured to control one or more light generation parameters of at least one of the first light generation device 110, the second light generation device 112, the light resource 412, or the light resource 414. In some embodiments, the one or more light generation parameters comprise at least one of light wavelength, light intensity, or other light generation parameter. The light wavelength of light output by at least one of the first light generation device 110, the second light generation device 112, the light resource 412, or the light resource 414 is between about a first wavelength to about a second wavelength. In some embodiments, the first wavelength is between about 360 nanometers to about 400 nanometers. In some embodiments, the second wavelength is between about 760 nanometers to about 830 nanometers. In some embodiments, the light wavelength of at least one of the first light generation device 110, the second light generation device 112, the light resource 412, or the light resource 414 is a visible light wavelength. Other values of the light wavelength of at least one of the first light generation device 110, the second light generation device 112, the light resource 412, or the light resource 414 are within the scope of the present disclosure.

In some embodiments, the first communication module 402 is used to communicate with at least one of the stocker controller, the computer of the shelf status monitoring apparatus, or one or more other devices. In some embodiments, the shelf status monitoring apparatus transmits information, such as at least one of one or more captured shelf monitoring images, one or more determinations of whether or not a shelving unit is associated with a potential shift event, or other information, using the first communication module 402. In some embodiments, the first communication module 402 transmits the information wirelessly. In some embodiments, the first communication module 402 comprises at least one of an Ethernet module or other type of communication module.

FIG. 4B illustrates a perspective view of a second portion 450 of the shelf status monitoring apparatus. In some embodiments, the second portion 450 of the shelf status monitoring apparatus comprises at least one of (i) the first light generation device 110, (ii) the second light generation device 112, (iii) a plate 430, (iv) a platform, such as a fork 428, of the load support component 106 of the stocking vehicle 108, or (v) other component.

In some embodiments, at least one of the first portion 400 or the second portion 450 of the shelf status monitoring apparatus is mounted to the stocking vehicle 108 via at least one of the frame 410 (shown in FIG. 4A), one or more mounting components 415 (shown in FIGS. 4A-4B), a jig, or one or more other suitable components. In some embodiments, during stocking operations performed using the stocking vehicle 108, at least one of the first portion 400 or the second portion 450 of the shelf status monitoring apparatus is mounted to the stocking vehicle 108. In some embodiments, during stocking operations performed using the stocking vehicle 108, at least one of the first portion 400 or the second portion 450 of the shelf status monitoring apparatus is used to at least one of capture shelf monitoring images or determine whether shelving units associated with the shelf monitoring images are associated with potential shift events.

In some embodiments, in response to determining that the second shelving unit 124F is associated with the second potential shift event, an inspection of the second shelving unit 124F is performed. In some embodiments, the inspection is performed using an inspection apparatus. In some embodiments, in response to determining that the second shelving unit 124F is associated with the second potential shift event, at least one of the stocker controller or the computer of the shelf status monitoring apparatus triggers the inspection, such as by transmitting an instruction to inspect the second shelving unit 124F to the inspection apparatus.

Figure 5:
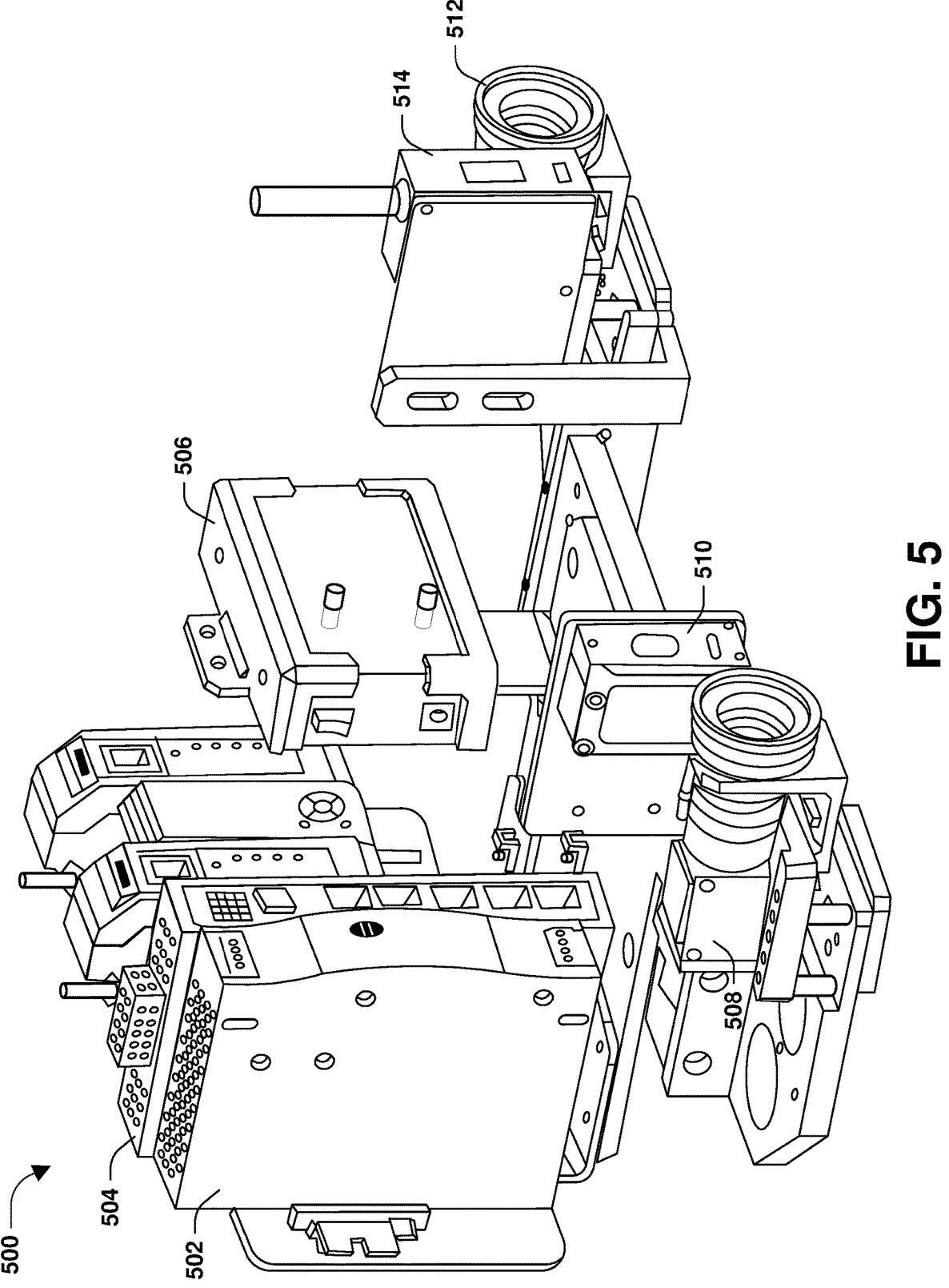
FIG. 5 illustrates a perspective view of at least a portion of an inspection apparatus, in accordance with some embodiments.

FIG. 5 illustrates at least at least a portion of the inspection apparatus (shown with reference number 500), according to some embodiments. In some embodiments, the inspection apparatus 500 comprises at least one of (i) a fourth image sensor 508, such as a camera, (ii) a fifth image sensor 512, such as a camera, (iii) a first distance sensor 510, (iv) a second distance sensor 514, (v) a second light controller 506, (vi) a second communication module 504, (vii) a second DC/DC converter 502, or (viii) other component. In some embodiments, the second light controller 506 is configured to control one or more light generation parameters of one or more light generation devices of at least one of the inspection apparatus 500 or a second stocking vehicle to which the inspection apparatus 500 is affixed. In some embodiments, the second stocking vehicle is the same as the stocking vehicle 108. In some embodiments, the second stocking vehicle is different than the stocking vehicle 108. The light wavelength of light output by the one or more light generation devices is between about a third wavelength to about a fourth wavelength. In some embodiments, the third wavelength is between about 360 nanometers to about 400 nanometers. In some embodiments, the fourth wavelength is between about 760 nanometers to about 830 nanometers. In some embodiments, the light wavelength of the one or more light generation devices is a visible light wavelength. Other values of the light wavelength of the one or more light generation devices are within the scope of the present disclosure. In some embodiments, the inspection apparatus 500 is mounted to the second stocking vehicle via at least one of a frame, one or more mounting components, a jig, or one or more other suitable components.

In some embodiments, the inspection of the second shelving unit 124F comprises capturing, using the inspection apparatus 500, a third image of a third view associated with the second predefined position of the second shelving unit 124F. In some embodiments, the second stocking vehicle transports the inspection apparatus 500 a position proximal the second shelving unit 124F. In some embodiments, at least one of the fourth image sensor 508 or the fifth image sensor 512 is used to capture the third image associated with the second shelving unit 124F. In some embodiments, the third image is captured at a time when at least one of the fourth image sensor 508 or the fifth image sensor 512 has the third view of the second predefined position of the second shelving unit 124F. In some embodiments, the inspection apparatus 500 determines that at least one of the fourth image sensor 508 or the fifth image sensor 512 has the third view of the second predefined position of the second shelving unit 124F based upon a current position of a component of at least one of the inspection apparatus 500 or a component of the second stocking vehicle matching a reference position corresponding to at least one of the fourth image sensor 508 or the fifth image sensor 512 having the third view of the second predefined position. In some embodiments, the inspection apparatus 500 determines that at least one of the fourth image sensor 508 or the fifth image sensor 512 has the third view of the second predefined position of the second shelving unit 124F using at least one of the first distance sensor 510 or the second distance sensor 514. In some embodiments, the second image is captured when the first component has the second reference position such that the second image has the third view of the second predefined position associated with the second shelving unit 124F.

In some embodiments, the third view of the third image corresponds to a second portion of the second shelving unit 124F when the second shelving unit 124F has the second predefined position. For example, if the second shelving unit 124F has the second predefined position and is not damaged and/or displaced, the second portion of the second shelving unit 124F is depicted in the third view. In some embodiments, when the second shelving unit 124F is damaged and/or displaced, at least a portion of the second portion of the second shelving unit 124F is not depicted in the third image, such as due, at least in part, to the second portion of the second shelving unit 124F being displaced from a predefined position of the second portion of the second shelving unit 124F. In some embodiments, the predefined position of the second portion of the second shelving unit 124F corresponds to a position of the second portion of the second shelving unit 124F when at least one of the second shelving unit 124F has the second predefined position or the second shelving unit 124F is not damaged. In some embodiments, the second portion of the second shelving unit 124F comprises at least a portion of a stopper, such as the stopper 208 and/or the stopper 210 illustrated in FIG. 2A, of the second shelving unit 124F. In some embodiments, the second portion of the second shelving unit 124F comprises the second portion 226 of the stopper 208 illustrated in FIG. 2B.

Figure 6A:
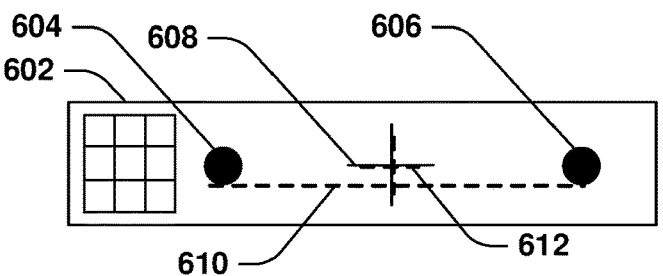
FIG. 6A illustrates a representation of an image, in accordance with some embodiments.
Figure 6B:
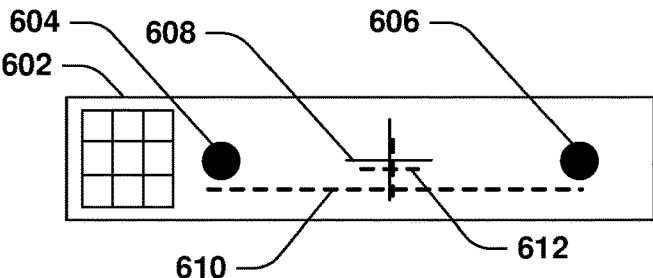
FIG. 6B illustrates a representation of an image, in accordance with some embodiments.
Figure 6C:
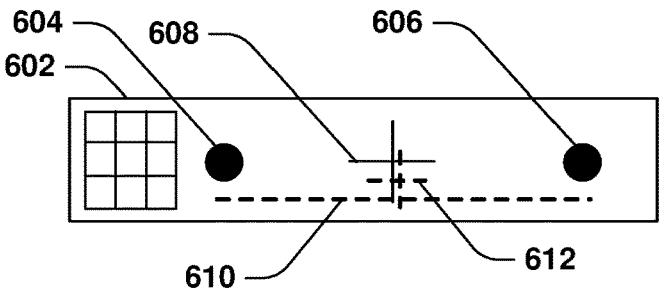
FIG. 6C illustrates a representation of an image, in accordance with some embodiments.

In some embodiments, the inspection apparatus 500 determines, based upon the third image, whether the determination that the second shelving unit 124F is associated with the second potential shift event is valid. Example representations of the third image (shown with reference number 602) are shown in FIGS. 6A-6C according to some embodiments. In some embodiments, the second portion of the second shelving unit 124F comprises at least one of a first opening 604 depicted in the third image 602, a second opening 606 depicted in the third image 602, or a third opening 608 depicted in the third image 602. In some embodiments, at least one of the first opening 604, the second opening 606, or the third opening 608 correspond to at least one of a slot, an aperture, etc. through a stopper of the second shelving unit 124F. In some embodiments, the inspection apparatus 500 determines whether the determination that the second shelving unit 124F is associated with the second potential shift event is valid based upon at least one of (i) a position of the first opening 604 depicted in the third image 602, (ii) a position of the second opening 606 depicted in the third image 602, or (iii) a position of the third opening 608 depicted in the third image 602. In some embodiments, the inspection apparatus 500 determines whether the determination that the second shelving unit 124F is associated with the second potential shift event is valid based upon at least one of (i) a distance between the position of the first opening 604 and a predefined position of the first opening 604, such as a reference position of the first opening 604, (ii) a distance between the position of the second opening 606 and a predefined position of the second opening 606, such as a reference position of the second opening 606, or (iii) a distance between the position of the third opening 608 and a predefined position of the third opening 608, such as a reference position of the third opening 608. In some embodiments, the inspection apparatus 500 determines that the determination that the second shelving unit 124F is associated with the second potential shift event is valid based upon at least one of (i) the distance between the position of the first opening 604 and the predefined position of the first opening 604 not exceeding a first threshold distance, (ii) the distance between the position of the second opening 606 and the predefined position of the second opening 606 not exceeding a second threshold distance, or (iii) the distance between the position of the third opening 608 and the predefined position of the third opening 608 not exceeding a third threshold distance. In some embodiments, the inspection apparatus 500 determines that the determination that the second shelving unit 124F is associated with the second potential shift event is not valid based upon at least one of (i) the distance between the position of the first opening 604 and the predefined position of the first opening 604 exceeding the first threshold distance, (ii) the distance between the position of the second opening 606 and the predefined position of the second opening 606 exceeding the second threshold distance, or (iii) the distance between the position of the third opening 608 and the predefined position of the third opening 608 exceeding the third threshold distance.

In some embodiments, the inspection apparatus 500 compares one or more features of the third image 602 with one or more landmarks to determine whether the determination that the second shelving unit 124F is associated with the second potential shift event is valid. In some embodiments, the one or more landmarks comprise a reference line 610 and a reference cross 612. The reference line 610 and the reference cross 612 are shown with dashed lines in FIGS. 6A-6C. In some embodiments, the inspection apparatus 500 determines whether the determination that the second shelving unit 124F is associated with the second potential shift event is valid based upon at least one of (i) whether the first opening 604 and the second opening 606 are aligned with the reference line 610, or (ii) whether the third opening 608 is aligned with the reference cross 612. In some embodiments, the first opening 604 and the second opening 606 are determined to be aligned with the reference line 610 based upon a determination that at least one of (i) the first opening 604 is within a fourth threshold distance of the reference line 610, or (ii) the second opening 606 is within the fourth threshold distance of the reference line 610. In some embodiments, the third opening 608 is determined to be aligned with the reference cross 612 based upon a determination that a center the third opening 608 is within a fifth threshold distance of a center of the reference cross 612. In some embodiments, the inspection apparatus 500 determines that the determination that the second shelving unit 124F is associated with the second potential shift event is valid based upon at least one of (i) determining that the first opening 604 and the second opening 606 are aligned with the reference line 610, or (ii) determining that the third opening 608 is aligned with the reference cross 612. In some embodiments, the inspection apparatus 500 determines that the determination that the second shelving unit 124F is associated with the second potential shift event is not valid based upon at least one of (i) determining that at least one of the first opening 604 or the second opening 606 is not aligned with the reference line 610, or (ii) determining that the third opening 608 is not aligned with the reference cross 612.

Embodiments are contemplated in which the inspection of the second shelving unit 124F is performed using one or more techniques other than those provided herein, such as using one or more other types of sensors other than (and/or in addition to) the fourth image sensor 508, the fifth image sensor 512, the first distance sensor 510, and/or the second distance sensor 514, other types of landmarks and/or markings other than (and/or in addition to) those explicitly shown in the annexed drawings, etc.

With respect to the example representation of the third image 602 provided in FIG. 6A, in some embodiments, the inspection apparatus 500 determines, based upon the third image 602, that at least one of (i) the second shelving unit 124F is in operating condition to be used for storing a product unit in the second storage location 132 over the second shelving unit 124F, or (ii) the determination that the second shelving unit 124F is associated with the second potential shift event is not valid.

With respect to the example representation of the third image 602 provided in FIG. 6B, in some embodiments, the inspection apparatus 500 determines, based upon the third image 602, that at least one of (i) the second shelving unit 124F is associated with the second potential shift event, or (ii) the determination that the second shelving unit 124F is associated with the second potential shift event is valid.

With respect to the example representation of the third image 602 provided in FIG. 6C, in some embodiments, the inspection apparatus 500 determines, based upon the third image 602, that at least one of (i) the second shelving unit 124F is associated with the second potential shift event, or (ii) the determination that the second shelving unit 124F is associated with the second potential shift event is valid.

In some embodiments, the inspection of the second shelving unit 124F comprises capturing, using the inspection apparatus 500, the third image 602 of the third view and a fourth image of a fourth view associated with the second predefined position of the second shelving unit 124F. In some embodiments, the third image 602 is captured using the fourth image sensor 508 and the fourth image is captured using the fifth image sensor 512. In some embodiments, the third image 602 and the fourth image are captured concurrently. In some embodiments, the third image 602 and the fourth image are captured when at least one of (i) the fourth image sensor 508 has the third view of the second predefined position of the second shelving unit 124F, or (ii) the fifth image sensor 512 has the fourth view of the second predefined position of the second shelving unit 124F.

In some embodiments, the fourth view of the fourth image corresponds to a third portion of the second shelving unit 124F when the second shelving unit 124F has the second predefined position. For example, if the second shelving unit 124F has the second predefined position and is not damaged and/or displaced, the third portion of the second shelving unit 124F is depicted in the third view. In some embodiments, when the second shelving unit 124F is damaged and/or displaced, at least a portion of the third portion of the second shelving unit 124F is not depicted in the fourth image, such as due, at least in part, to the third portion of the second shelving unit 124F being displaced from a predefined position of the third portion of the second shelving unit 124F. In some embodiments, the predefined position of the third portion of the second shelving unit 124F corresponds to a position of the third portion of the second shelving unit 124F when at least one of the second shelving unit 124F has the second predefined position or the second shelving unit 124F is not damaged. In some embodiments, the third portion of the second shelving unit 124F comprises at least a portion of a stopper, such as the stopper 208 and/or the stopper 210 illustrated in FIG. 2A, of the second shelving unit 124F. In some embodiments, the second portion of the second shelving unit 124F comprises at least a portion of a first stopper of the second shelving unit 124F, such as the stopper 208 illustrated in FIG. 2A, and the third portion of the second shelving unit 124F comprises at least a portion of a second stopper of the second shelving unit 124F, such as the stopper 210 illustrated in FIG. 2A.

Figure 7A:
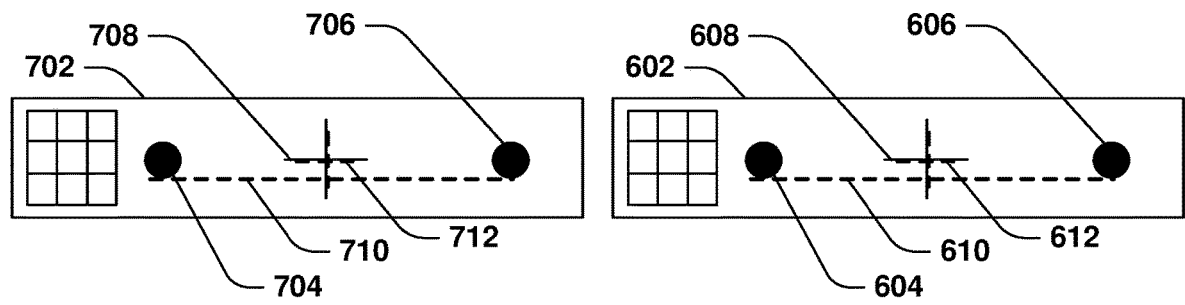
FIG. 7A illustrates a representation of two images, in accordance with some embodiments.
Figure 7B:
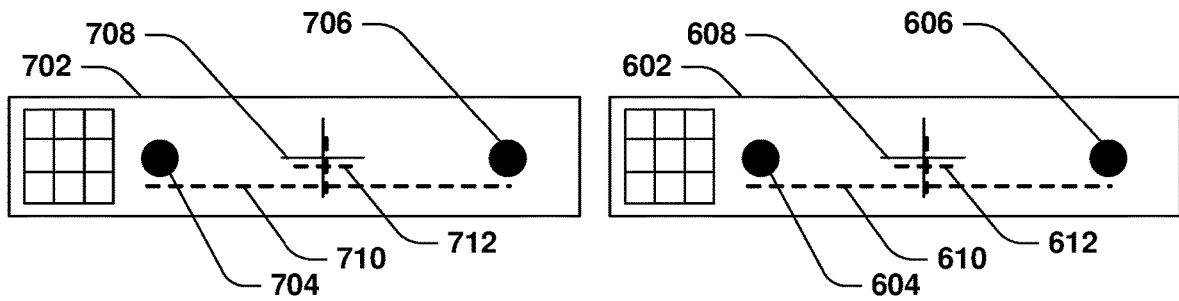
FIG. 7B illustrates a representation of two images, in accordance with some embodiments.
Figure 7C:
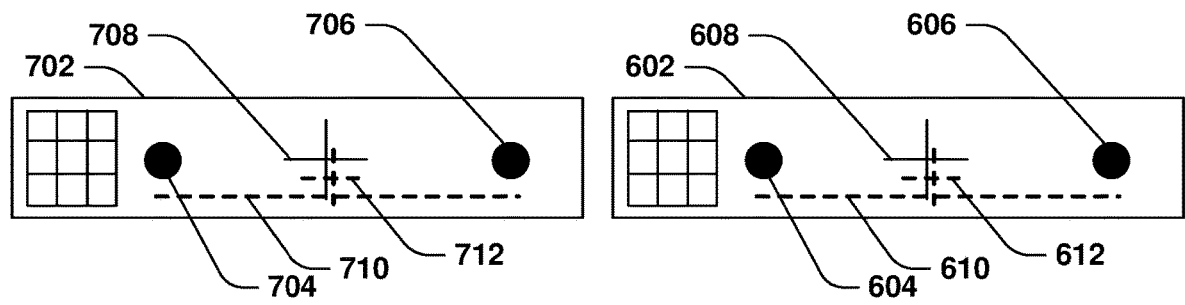
FIG. 7C illustrates a representation of two images, in accordance with some embodiments.

In some embodiments, the inspection apparatus 500 determines, based upon the third image 602 and the fourth image, whether the determination that the second shelving unit 124F is associated with the second potential shift event is valid. Example representations of the third image 602 and the fourth image (shown with reference number 702) are shown in FIGS. 7A-7C according to some embodiments. In some embodiments, the third portion of the second shelving unit 124F comprises at least one of a fourth opening 704 depicted in the fourth image 702, a fifth opening 706 depicted in the fourth image 702, or a sixth opening 708 depicted in the fourth image 702. In some embodiments, at least one of the fourth opening 704, the fifth opening 706, or the sixth opening 708 correspond to at least one of a slot, an aperture, etc. through a stopper of the second shelving unit 124F. In some embodiments, the inspection apparatus 500 determines whether the determination that the second shelving unit 124F is associated with the second potential shift event is valid based upon at least one of (i) a distance between a position of the first opening 604 depicted in the third image 602 and a predefined position of the first opening 604, such as a reference position of the first opening 604, (ii) a distance between a position of the second opening 606 depicted in the third image 602 and a predefined position of the second opening 606, such as a reference position of the second opening 606, (iii) a distance between a position of the third opening 608 depicted in the third image 602 and a predefined position of the third opening 608, such as a reference position of the third opening 608, (iv) a distance between a position of the fourth opening 704 depicted in the fourth image 702 and a predefined position of the fourth opening 704, such as a reference position of the fourth opening 704, (v) a distance between a position of the fifth opening 706 depicted in the fourth image 702 and a predefined position of the fifth opening 706, such as a reference position of the fifth opening 706, or (vi) a distance between a position of the sixth opening 708 depicted in the fourth image 702 and a predefined position of the sixth opening 708, such as a reference position of the sixth opening 708.

In some embodiments, the inspection apparatus 500 compares one or more features of the fourth image 702 with one or more landmarks, such as a reference line 710 and a reference cross 712, to determine whether the determination that the second shelving unit 124F is associated with the second potential shift event is valid. In some embodiments, the inspection apparatus 500 determines whether the determination that the second shelving unit 124F is associated with the second potential shift event is valid based upon at least one of (i) whether the first opening 604 and the second opening 606 are aligned with the reference line 610, (ii) whether the third opening 608 is aligned with the reference cross 612, (iii) whether the fourth opening 704 and the fifth opening 706 are aligned with the reference line 710, or (iv) whether the sixth opening 708 is aligned with the reference cross 712.

In some embodiments, the shelf status monitoring apparatus 804 uses two image sensors to capture two images during a stocking operation, such as using one or more of the techniques provided herein with respect to using the inspection apparatus 500 to use the fourth image sensor 508 and the fifth image sensor 512 to capture the third image 602 and the fourth image 702, respectively. In some embodiments, the two images are captured concurrently. In some embodiments, the two images are captured using different image sensors, such as the second image sensor 416 and the third image sensor 418. Embodiments are contemplated in which the two images are captured using a single image sensor, and/or where the two images corresponds to sections of a larger image. Referring back to FIG. 2A, in some embodiments, the two images comprise (i) an image of a view of a predefined position of the first portion 224 of the stopper 208, and (ii) an image of a view of a predefined position of a portion of the stopper 210, such as a portion of the stopper 210 comprising a reflective label. In some embodiments, whether or not the shelving unit 124 is associated with a potential shift event is determined based upon the two images. Embodiments are contemplated in which more than two images are at least one of captured or used to determine whether the shelving unit 124 is associated with a potential shift event.

In some embodiments, in response to determining that the determination that the second shelving unit 124F is associated with the second potential shift event is valid, the second shelving unit 124F is flagged as out of service by at least one of the stocker controller or the inspection apparatus 500.

In some embodiments, in response to determining that the determination that the second shelving unit 124F is associated with the second potential shift event is valid, the inspection apparatus 500 transmits an indication that the second shelving unit 124F is damaged to the stocker controller.

In some embodiments, in response to determining that the determination that the second shelving unit 124F is associated with the second potential shift event is valid, at least one of the stocker controller or the inspection apparatus 500 transmits a second instruction to repair the second shelving unit 124F to the maintenance event scheduling module. In some embodiments, the maintenance event scheduling module schedules a maintenance event for the second shelving unit 124F in response to at least one of the second instruction to repair the second shelving unit 124F or determining that the determination that the second shelving unit 124F is associated with the second potential shift event is valid.

Figure 8:
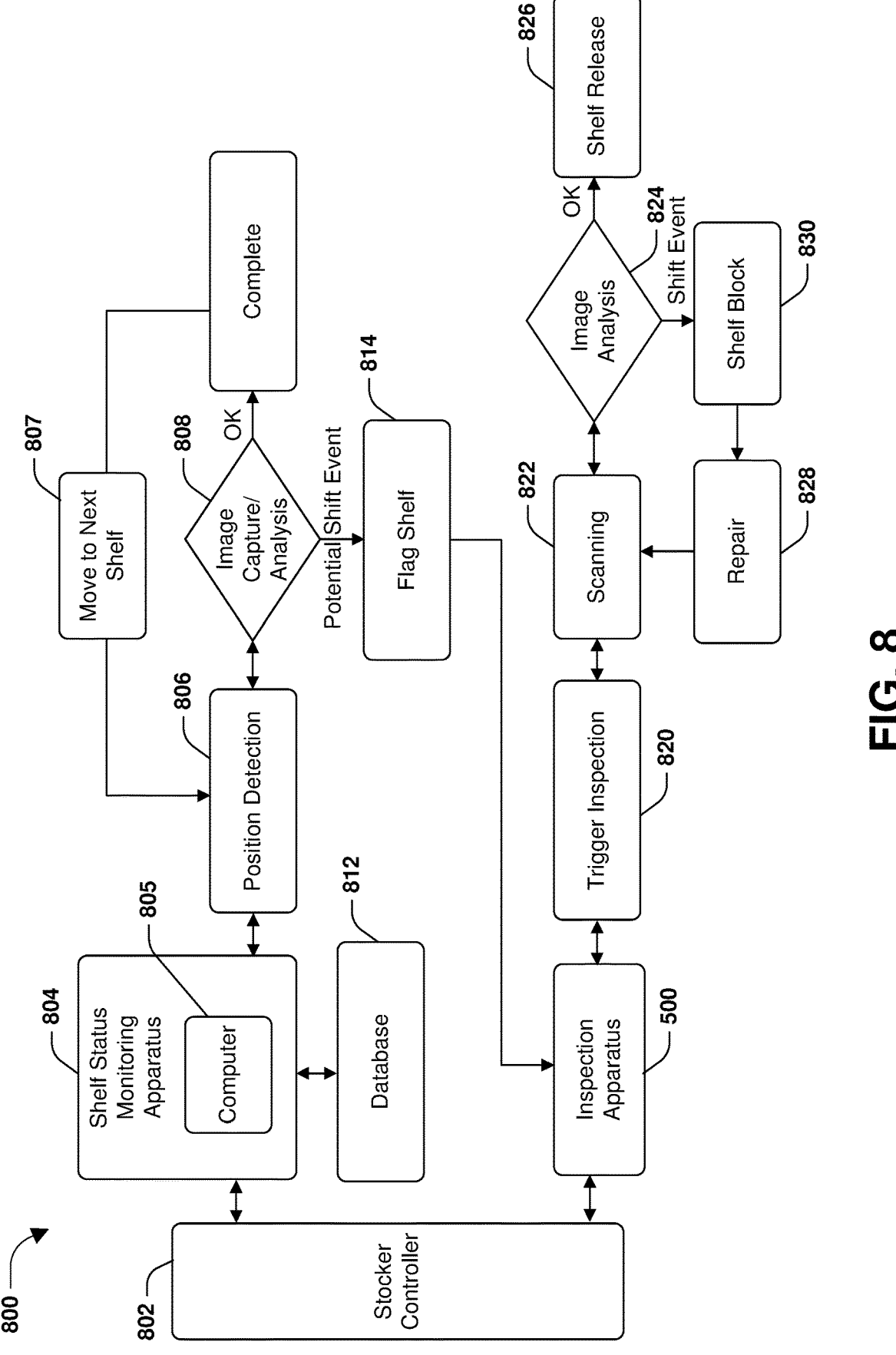
FIG. 8 is a schematic block diagram illustrating a scenario associated with an automated material handling system, in accordance with some embodiments.

FIG. 8 illustrates a diagram of a scenario 800 associated with the automated material handling system 100, according to some embodiments. In some embodiments, the automated material handling system 100 comprises at least one of the shelf status monitoring apparatus (shown with reference number 804), the inspection apparatus 500, or the stocker controller 802. In some embodiments, the stocker controller 802 comprises a material control system (MCS). In some embodiments, the stocker controller 802 at least one of communicates with, controls, or provides instructions to one or more stocking vehicles, such as the stocking vehicle 108, of the automated material handling system 100. In some embodiments, the shelf status monitoring apparatus 804 communicates with at least one of the stocker controller 802 or a database 812 using the first communication module 402 (shown in FIG. 4A). In some embodiments, the shelf status monitoring apparatus 804 provides shelf monitoring images of shelving units for storage on the database 812. In some embodiments, the database 812 is used to store information comprising at least one of shelf health statuses, the list of candidate shelving units, the list of flagged shelving units, or other information. In some embodiments, the inspection apparatus 500 communicates with the stocker controller 802 using the second communication module 504 (shown in FIG. 5).

In some embodiments, at least one of the shelf status monitoring apparatus 804 or the stocker controller 802 perform position detection 806 to determine when an image sensor of the shelf status monitoring apparatus 804 has a suitable view for capturing a shelf monitoring image of a shelving unit. In some embodiments, the shelf monitoring image is captured during a stocking operation associated with the shelving unit. Embodiments are contemplated in which the shelf monitoring image is captured at a time that is not during stocking operation associated with the shelving unit. In some embodiments, the shelf monitoring image is captured and/or analyzed, at 808, to determine whether the shelving unit is associated with a potential shift event. In some embodiments, whether the shelving unit is associated with the potential shift event is determined using the computer (shown with reference number 805) of the shelf status monitoring apparatus 804. In some embodiments, in response to a determination that the shelving unit is not associated with the potential shift event, at least one of the position detection 806 or the image capture and/or analysis 808 is repeated after at least one of the shelf status monitoring apparatus 804 or the stocker controller 802 move 807 to a subsequent shelving unit for a subsequent stocking operation.

In some embodiments, in response to a determination that the shelving unit is associated with the potential shift event, the shelving unit is flagged 814 as out of service by at least one of the shelf status monitoring apparatus 804 or the stocker controller 802. In some embodiments, flagging 814 the shelving unit as out of service triggers 820 the inspection apparatus 500 to perform an inspection of the shelving unit. In some embodiments, at least one of the shelf status monitoring apparatus 804 or the stocker controller 802 transmit an instruction to perform the inspection of the shelving unit in response to at least one of (i) determining that the shelving unit is associated with the potential shift event, or (ii) flagging the shelving unit as out of service.

In some embodiments, the inspection of the shelving unit comprises scanning 822 the shelving unit using at least one of the fourth image sensor 508, the fifth image sensor 512, the first distance sensor 510, the second distance sensor 514, or other component to at least one of (i) determine when at least one of the fourth image sensor 508 or the fifth image sensor 512 has a suitable view of a predefined position of the shelving unit, or (ii) capture an image of the suitable view of the predefined position of the shelving unit. In some embodiments, the inspection of the shelving unit comprises analyzing 824 the captured image to determine whether the determination that the shelving unit is associated with the potential shift event is valid.

In some embodiments, in response to determining that the determination that the shelving unit is associated with the potential shift event is not valid, the shelving unit is released 826 from out of service status. In some embodiments, in response to determining that the determination that the shelving unit is associated with the potential shift event is not valid, the shelving unit is removed from the list of flagged shelving units.

In some embodiments, in response to determining that the determination that the shelving unit is associated with the potential shift event is valid, the shelving unit is blocked 830 from use such that the shelving unit is not used for storing product units. In some embodiments, blocking 830 the shelving unit comprises including the shelving unit in a list of blocked shelving units. In some embodiments, the list of blocked shelving units indicates shelving units that are blocked for use. In some embodiments, the stocker controller 802 does not use the shelving unit to store a product unit based upon the shelving unit being included in the list of blocked shelving units.

In some embodiments, in response to determining that the determination that the shelving unit is associated with the potential shift event is valid, the shelving unit is repaired 828. In some embodiments, in response to determining that the determination that the shelving unit is associated with the potential shift event is valid, a maintenance device of the automated material handling system 100 transmits an instruction to an automatic maintenance machine, such as a robot, to repair the shelving unit. In some embodiments, in response to the instruction, the automatic maintenance machine automatically repairs the shelving unit. In some embodiments, in response to repairing 828 the shelving unit, a second inspection of the shelving unit is performed via at least one of scanning 822 the shelving unit to capture an image or analyzing 824 the image to determine whether the shelving unit is associated with a shift event.

A method 900 of determining whether a shelving unit is associated with a potential shift event is illustrated in FIG. 9 in accordance with some embodiments. At 902, a first stocking operation associated with a first shelving unit is performed using a stocking vehicle. In some embodiments, the first stocking operation comprises a put operation comprising transferring a first product unit from a load support component of the stocking vehicle to a first storage location over the first shelving unit. In some embodiments, the first stocking operation comprises a get operation comprising transferring the first product unit from the first storage location over the first shelving unit to the load support component of the stocking vehicle. At 904, a first image of a view associated with a first predefined position of the first shelving unit is captured during the first stocking operation. In some embodiments, the first image is captured using a first image sensor coupled to the stocking vehicle. At 906, whether the first shelving unit is associated with a potential shift event is determined based upon the first image. In some embodiments, in response to determining that the first shelving unit is associated with the potential shift event, the first shelving unit is flagged as out of service.

Figure 10A:
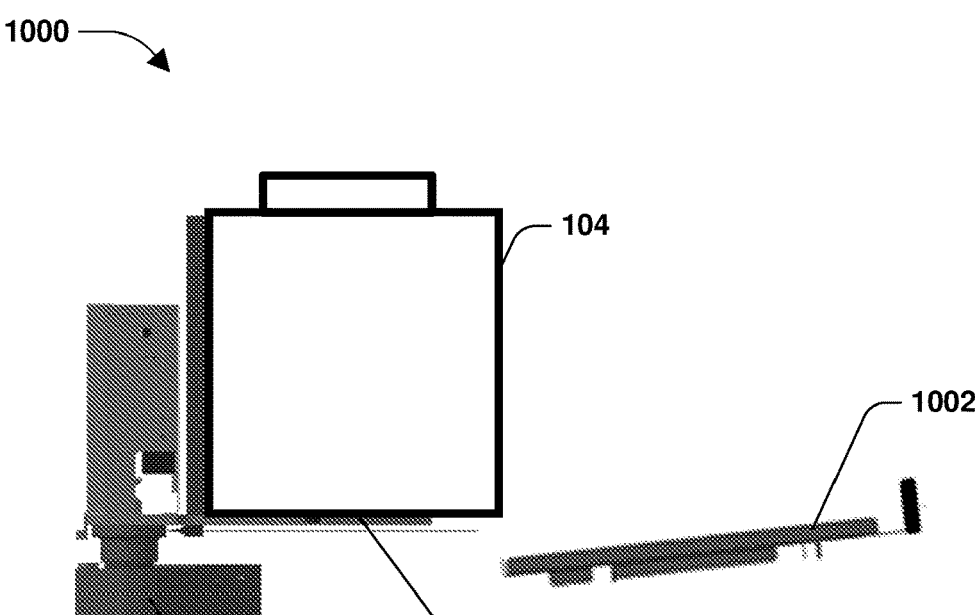
FIG. 10A illustrates a side view of a shelving unit associated with a potential shift event, in accordance with some embodiments.
Figure 10B:
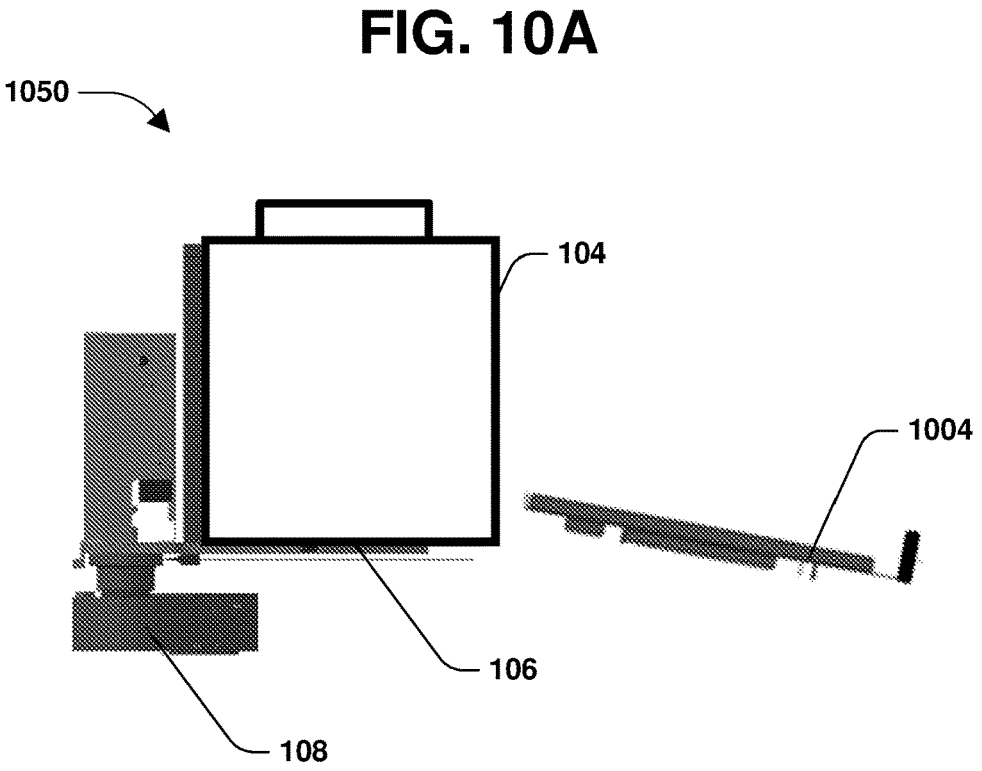
FIG. 10B illustrates a side view of a shelving unit associated with a potential shift event, in accordance with some embodiments.

FIG. 10A illustrates a representation 1000 of a shelving unit 1002 determined to be associated with a potential shift event, according to some embodiments. In some embodiments, the shelving unit 1002 at least one of bends or tilts downwards, such as due, at least in part, to an impact and/or pressure from an object during a stocking operation, such as impact and/or pressure from at least one of the stocking vehicle 108, the load support component 106 of the stocking vehicle 108, or a product unit 104. In some embodiments, the stocking vehicle 108 placing a product unit 104 onto the shelving unit 1002 can cause damage to at least one of the product unit 104, the shelving unit 1002, or other component, such as due, at least in part, to the shelving unit 1002 bending downwards. Using the techniques provided herein, in some embodiments, the shelf status monitoring apparatus determines that the shelving unit 1002 is associated with the potential shift event and at least one of (i) flags the shelving unit 1002 as out of service, or (ii) facilitates repair of the shelving unit, thereby mitigating damage to at least one of the shelving unit 1002, the stocking vehicle 108, or the product unit 104. FIG. 10B illustrates a representation 1050 of a shelving unit 1004 determined to be associated with a potential shift event, according to some embodiments. In some embodiments, the shelving unit 1004 at least one of bends or tilts upwards, such as due, at least in part, to an impact and/or pressure from an object during a stocking operation, such as impact and/or pressure from at least one of the stocking vehicle 108, the load support component 106 of the stocking vehicle 108, or a product unit 104.

In some embodiments, a system is provided. In some embodiments, the system comprises the automated material handling system. In some embodiments, the system comprises the inspection apparatus 500. In some embodiments, the system comprises the shelf status monitoring apparatus. In some embodiments, the system comprises a shelving unit 124 (shown in FIGS. 2A-2B). In some embodiments, the shelving unit 124 comprises the stopper 208 comprising the first portion 224 and the second portion 226. In some embodiments, the shelving unit 124 comprises (i) the reflective label 222 in the first portion 224 of the stopper 208, (ii) the cross-shaped opening 230 in the second portion 226 of the stopper 208, (iii) the first circle-shaped opening 228 in the second portion 226 of the stopper 208, and (iv) the second circle-shaped opening 232 in the second portion 226 of the stopper 208. In some embodiments, at least one of the second image sensor 416 or the third image sensor 418 of the shelf status monitoring apparatus captures an image having a view corresponding to the first portion 224 of the stopper 208. In some embodiments, at least one of the fourth image sensor 508 or the fifth image sensor 512 of the inspection apparatus 500 captures a second image having a view corresponding to the second portion 226 of the stopper 208.

Figure 11:
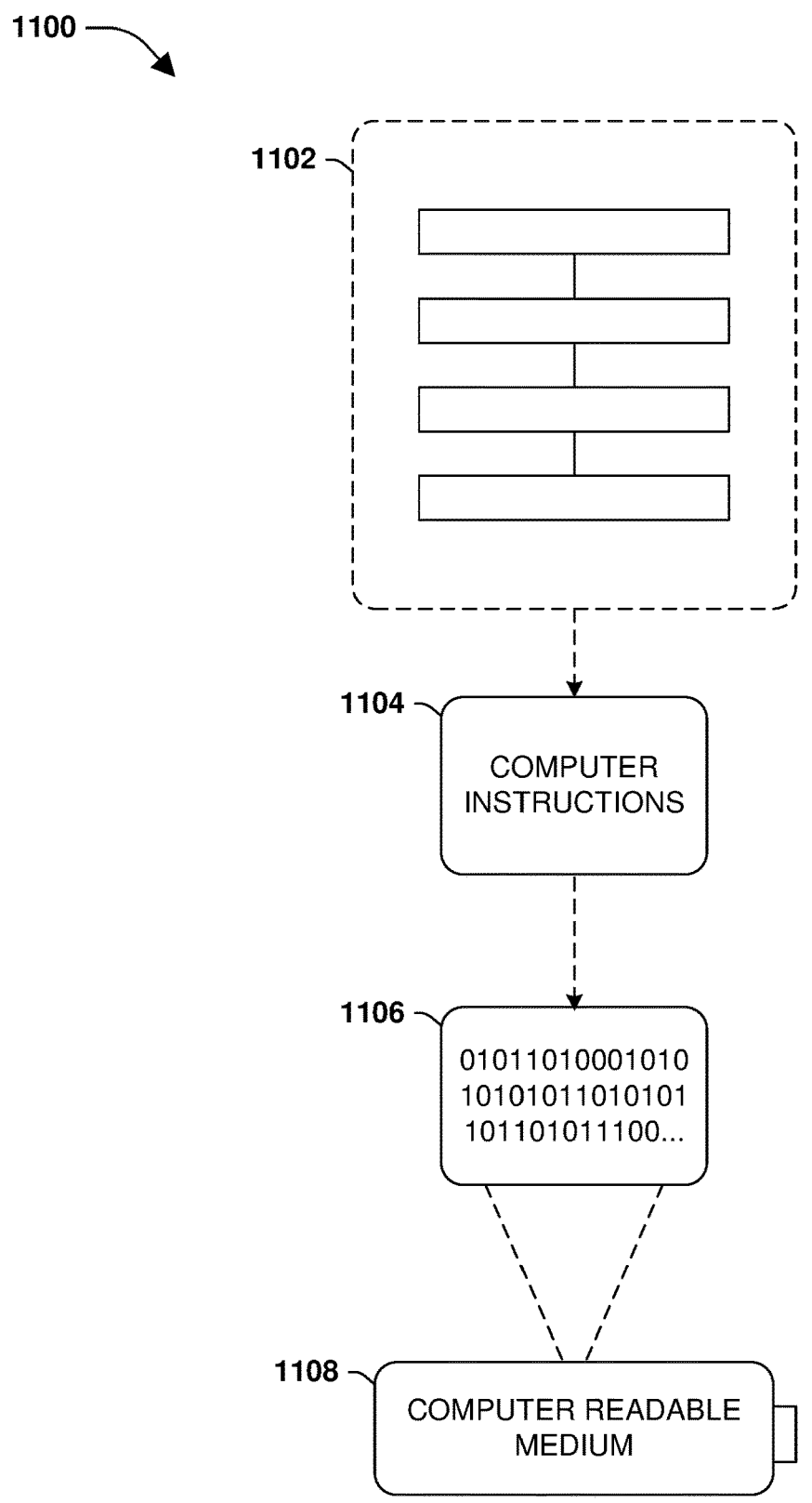
FIG. 11 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 11, wherein the embodiment 1100 comprises a computer-readable medium 1108 (e.g., a CD-R, DVD-R, flash drive, a platter of a hard disk drive, etc.), on which is encoded computer-readable data 1106. This computer-readable data 1106 in turn comprises a set of processor-executable computer instructions 1104 configured to implement one or more of the principles set forth herein when executed by a processor. In some embodiments 1100, the processor-executable computer instructions 1104 are configured to implement a method 1102, such as at least some of the aforementioned method(s) when executed by a processor. In some embodiments, the processor-executable computer instructions 1104 are configured to implement a system, such as at least some of the one or more aforementioned systems when executed by a processor. In some embodiments, the processor-executable computer instructions 1104 are configured to implement an apparatus, such as at least some of the one or more aforementioned apparatuses when executed by a processor. Many such computer-readable media may be devised by those of ordinary skill in the art that are configured to operate in accordance with the techniques presented herein.

In some embodiments, a method is provided. The method includes performing a first stocking operation associated with a first shelving unit using a stocking vehicle. The first stocking operation includes a put operation including transferring a first product unit from a load support component of the stocking vehicle to a first storage location over the first shelving unit, or a get operation including transferring the first product unit from the first storage location over the first shelving unit to the load support component of the stocking vehicle. The method includes capturing, using a first image sensor coupled to the stocking vehicle, a first image of a view associated with a first predefined position of the first shelving unit during the first stocking operation. The method includes determining, based upon the first image, whether the first shelving unit is associated with a potential shift event.

In some embodiments, an automated material handling system is provided. The automated material handling system includes a stocking vehicle configured to perform a first stocking operation associated with a first shelving unit. The first stocking operation includes a put operation including transferring a first product unit from a load support component of the stocking vehicle to a first storage location over the first shelving unit, or a get operation including transferring the first product unit from the first storage location over the first shelving unit to the load support component of the stocking vehicle. The automated material handling system includes a shelf status monitoring apparatus including a first image sensor and a computer. The first image sensor is configured to capture, during the first stocking operation, a first image of a view associated with a first predefined position of the first shelving unit. The computer is configured to determine, based upon the first image, whether the first shelving unit is associated with a potential shift event.

In some embodiments, a method is provided. The method includes performing, using a stocking vehicle, a first stocking operation associated with a first shelving unit. The first stocking operation includes a put operation including transferring a first product unit from a load support component of the stocking vehicle to a first storage location over the first shelving unit, or a get operation including transferring the first product unit from the first storage location over the first shelving unit to the load support component of the stocking vehicle. The method includes capturing a first image of a view associated with a first predefined position of the first shelving unit during the first stocking operation. The method includes determining, based upon the first image, whether the first shelving unit is associated with a potential shift event. The method includes in response to determining that the first shelving unit is associated with the potential shift event, flagging the first shelving unit as out of service.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" and/or the like is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:
1. A method, comprising:
performing, using a stocking vehicle, a first stocking operation associated with a first shelving unit, wherein the first stocking operation comprises:
a put operation comprising transferring a first product unit from a load support component of the stocking vehicle to a first storage location over the first shelving unit; or a get operation comprising transferring the first product unit from the first storage location over the first shelving unit to the load support component of the stocking vehicle;

emitting, using a light generation device coupled to the stocking vehicle, a beam of light;

capturing, using a first image sensor coupled to the stocking vehicle, a first image of a view associated with a first predefined position of the first shelving unit during the first stocking operation while the beam of light is being emitted; and determining, based upon the first image, whether the first shelving unit is associated with a potential shift event, wherein determining whether the first shelving unit is associated with the potential shift event comprises:

comparing, in the first image, a position of a reflection of the beam of light to a plurality of lines disposed on a surface of the first shelving unit; and determining, based upon a relative position between the reflection of the beam of light and the plurality of lines, whether the first shelving unit is associated with the potential shift event.

2. The method of claim 1, wherein:

the plurality of lines are part of a reflective label on the surface of the first shelving unit.

3. The method of claim 1, comprising:

in response to determining that the first shelving unit is associated with the potential shift event, flagging the first shelving unit as out of service.

4. The method of claim 3, comprising:

not transferring a second product unit to the first storage location over the first shelving unit based upon the first shelving unit being flagged as out of service.

5. The method of claim 1, comprising:

in response to determining that the first shelving unit is associated with the potential shift event, performing an inspection of the first shelving unit.

6. The method of claim 5, wherein performing the inspection comprises:

capturing a second image of a second view associated with the first predefined position of the first shelving unit; and determining, based upon the second image, whether the determination that the first shelving unit is associated with the potential shift event is valid.

7. The method of claim 6, comprising:

in response to determining that the determination that the first shelving unit is associated with the potential shift event is valid, transmitting an instruction to repair the first shelving unit.

8. The method of claim 6, comprising:

in response to determining that the determination that the first shelving unit is associated with the potential shift event is valid, flagging the first shelving unit as out of service.

9. The method of claim 6, comprising:

in response to determining that the determination that the first shelving unit is associated with the potential shift event is not valid, at least one of:

removing the first shelving unit from a list of shelving units flagged as out of service; or transferring a second product unit to the first storage location over the first shelving unit.

10. The method of claim 6, wherein:

the view of the first image corresponds to a first portion of the first shelving unit when the first shelving unit has the first predefined position; and the second view of the second image corresponds to a second portion of the first shelving unit when the first shelving unit has the first predefined position.

11. The method of claim 10, wherein:

the first portion of the first shelving unit comprises a reflective label comprising the plurality of lines and disposed on a surface of the first shelving unit;

the second portion of the first shelving unit defines a first opening and a second opening; and determining whether the determination that the first shelving unit is associated with the potential shift event is valid comprises determining whether the determination that the first shelving unit is associated with the potential shift event is valid based upon a position of the first opening depicted in the second image and a position of the second opening depicted in the second image.

12. The method of claim 1, wherein:

the potential shift event corresponds to a shift of the first shelving unit from the first predefined position to a second position.

13. The method of claim 1, wherein:

the first product unit comprises a first wafer storage device.

14. An automated material handling system, comprising:

a stocking vehicle configured to perform a first stocking operation associated with a first shelving unit, wherein the first stocking operation comprises:

a put operation comprising transferring a first product unit from a load support component of the stocking vehicle to a first storage location over the first shelving unit; or a get operation comprising transferring the first product unit from the first storage location over the first shelving unit to the load support component of the stocking vehicle; and a shelf status monitoring apparatus comprising:

a first image sensor coupled to the stocking vehicle, wherein the first image sensor is configured to capture, during the first stocking operation, a first image of a view associated with a first predefined position of the first shelving unit; and a computer configured to determine, based upon the first image, whether the first shelving unit is associated with a potential shift event, wherein:

the load support component comprises a first portion underlying the first product unit when the first product unit is disposed on the load support component, and the first image sensor is disposed on a sidewall of the first portion of the load support component, and the computer is configured to determine, based upon the first image, whether the first shelving unit is associated with the potential shift event by:

comparing, in the first image, a position of a reflection of a beam of light emitted from a light generation device coupled to the stocking vehicle to a plurality of lines disposed on a surface of the first shelving unit; and determining, based upon a relative position between the reflection of the beam of light and the plurality of lines, whether the first shelving unit is associated with the potential shift event.

15. The automated material handling system of claim 14, wherein the shelf status monitoring apparatus comprises:

a light generation device is, coupled to the stocking vehicle, configured to emit the a beam of light toward the first shelving unit while the image sensor is capturing the first image, wherein the computer is configured to compare a position of a reflection of the beam of light off of the first shelving unit depicted in the first image with a position of a landmark depicted in the first image to determine whether the first shelving unit is associated with the potential shift event.

16. The automated material handling system of claim 14, comprising:

an inspection apparatus, wherein:

in response to determining that the first shelving unit is associated with the potential shift event, the computer is configured to trigger the inspection apparatus to perform an inspection of the first shelving unit;

in response to being triggered to perform the inspection of the first shelving unit, the inspection apparatus is configured to capture a second image of a second view associated with the first predefined position of the first shelving unit; and the computer is configured to determine, based upon the second image, whether the determination that the first shelving unit is associated with the potential shift event is valid.

17. The automated material handling system of claim 14, wherein:

the first product unit comprises a first wafer storage device.

18. A method, comprising:

performing, using a stocking vehicle, a first stocking operation associated with a first shelving unit, wherein the first stocking operation comprises:

a put operation comprising transferring a first product unit from a load support component of the stocking vehicle to a first storage location over the first shelving unit; or a get operation comprising transferring the first product unit from the first storage location over the first shelving unit to the load support component of the stocking vehicle;

capturing a first image of a view associated with a first predefined position of the first shelving unit during the first stocking operation;

determining, based upon the first image, whether the first shelving unit is associated with a potential shift event;

capturing a second image of a second view associated with the first predefined position of the first shelving unit;

determining whether the determination that the first shelving unit is associated with the potential shift event is valid based upon a comparison of a first opening having a first cross-sectional profile to a first reference feature and a comparison of a second opening having a second cross-sectional profile to a second reference feature, wherein the second cross-sectional profile is different than the first cross-sectional profile; and in response to determining that the first shelving unit is associated with the potential shift event, flagging the first shelving unit as out of service.

19. The method of claim 18, comprising:

emitting a beam of light while capturing the first image, wherein determining whether the first shelving unit is associated with the potential shift event comprises comparing a position of a reflection of the beam of light depicted in the first image with a position of a landmark depicted in the first image.

20. The method of claim 18, comprising:

emitting a beam of light toward the first predefined position of the first shelving unit;

wherein determining whether the first shelving unit is associated with the potential shift event comprises:

comparing, in the first image, a position of a reflection of the beam of light to a plurality of lines disposed on a surface of the first shelving unit; and determining, based upon a relative position between the reflection of the beam of light and the plurality of lines, whether the first shelving unit is associated with the potential shift event.

* * * * *